United States Patent
Unuma et al.

(10) Patent No.: US 8,271,693 B2
(45) Date of Patent: Sep. 18, 2012

(54) CABLE CONNECTION SUPPORT APPARATUS AND METHOD OF SUPPORTING CABLE CONNECTION

(75) Inventors: Munetoshi Unuma, Hitachinaka (JP); Shinya Yuda, Hitachi (JP); Ryosuke Shigemi, Hitachi (JP); Toshimi Yokota, Hitachiota (JP); Kozo Nakamura, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/814,601

(22) Filed: Jun. 14, 2010

(65) Prior Publication Data

US 2010/0332689 A1 Dec. 30, 2010

(30) Foreign Application Priority Data

Jun. 15, 2009 (JP) ................................. 2009-141788

(51) Int. Cl.
*G06F 3/00* (2006.01)
*G06F 13/00* (2006.01)
(52) U.S. Cl. ........................ 710/8; 710/2; 710/5; 710/36
(58) Field of Classification Search ........................ None
See application file for complete search history.

(56) References Cited

U.S. PATENT DOCUMENTS

2008/0240724 A1 * 10/2008 Aguren ......................... 398/139

FOREIGN PATENT DOCUMENTS

| JP | 2005-244615 | 9/2005 |
| JP | 2007-279914 | 10/2007 |

OTHER PUBLICATIONS

RFID Reader Module, Feb. 2006, Parallax, [online, accessed on Aug. 26, 2011], URL: http://www.ece.nus.edu.sg/ee2001/html/Common/RFID-Reader-v1.2.pdf.*

* cited by examiner

*Primary Examiner* — Scott Sun
(74) *Attorney, Agent, or Firm* — Antonelli, Terry, Stout & Kraus, LLP.

(57) ABSTRACT

A cable connection support apparatus has a structure in which a master apparatus and a slave apparatus are connected to both ends of a plurality of cables, and each apparatus is connected to each cable by a connecting terminal. The master apparatus and the slave apparatus are grounded. The master apparatus makes, for each connected cable, an inquiry about a position of a terminal of the slave apparatus to which the cable is connected, and inspects for inter-continuity, grounded connection, and unintentional disconnection. The connection destinations and inspection results are displayed on a display apparatus. Consequently, the connection condition for each cable wire in a cable can be confirmed.

13 Claims, 24 Drawing Sheets

| MASTER-SIDE TERMINAL NUMBER | CONNECTION CONDITION | RECEIVED ID (SLAVE TERMINAL NUMBER) | RESISTANCE VALUE OF CABLE (Ω) |
|---|---|---|---|
| 1 | PROPER CONNECTION | 1 | 0.8 |
| 2 | PROPER CONNECTION | 2 | 1.0 |
| 3 | PROPER CONNECTION | 4 | 0.9 |
| 4 | PROPER CONNECTION | 3 | 1.1 |
| 5 | INTER-CONTINUITY | 5, 6 | 0.4 |
| 6 | INTER-CONTINUITY | 5, 6 | 0.5 |
| 7 | GROUNDED CONNECTION | | |
| 8 | UNINTENTIONAL DISCONNECTION | | |

FIG. 13
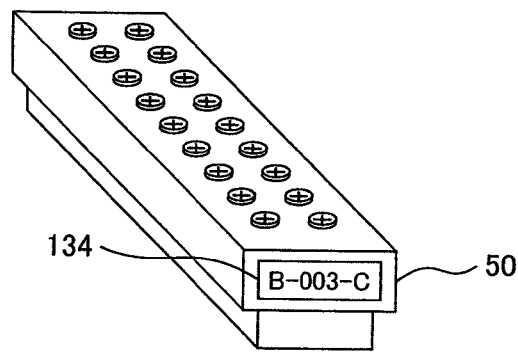
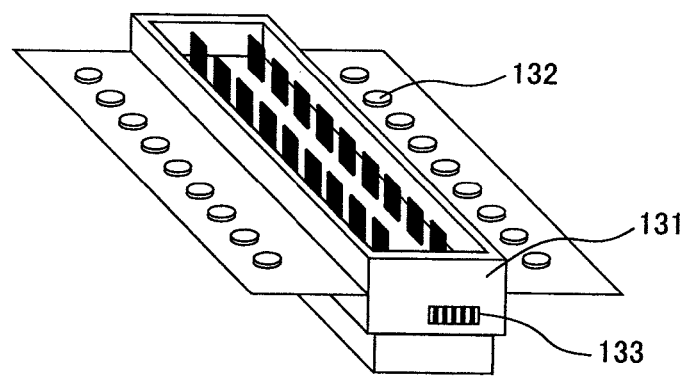
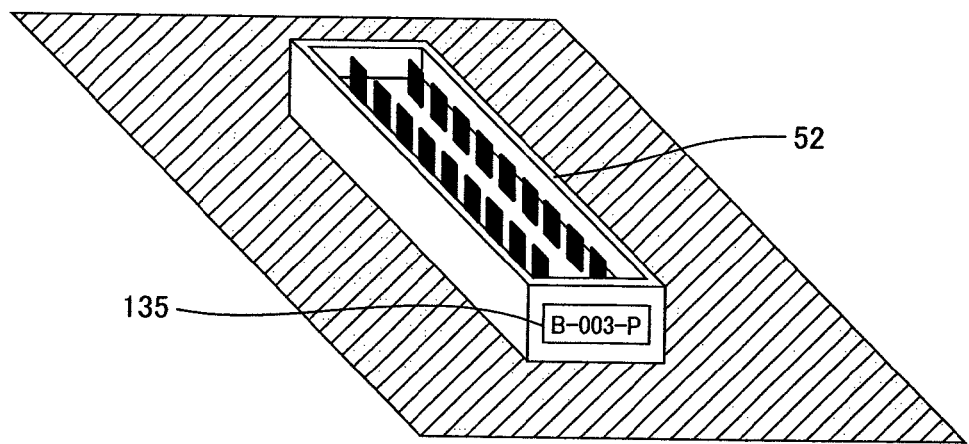

FIG. 15

MASTER-SIDE TERMINAL BLOCK

| TERMINAL BLOCK NUMBER : A-001 ||||
|---|---|---|---|
| TERMINAL NUMBER | WIRE NUMBER | CABLE NUMBER | DESTINATION |
| 1 | AAB001 | AAB | B-003 |
| 2 | AAB002 |  | B-003 |
| 3 | AAB003 |  | B-003 |
| 4 | AAB004 |  | B-003 |
| 5 | AAC001 | AAC | B-003 |
| 6 | AAC002 |  | B-003 |
| 7 | AAC003 |  | B-003 |
| 8 | AAC004 |  | B-003 |

FIG. 16

SLAVE-SIDE TERMINAL BLOCK

| TERMINAL BLOCK NUMBER : B-003 ||||
|---|---|---|---|
| TERMINAL NUMBER | WIRE NUMBER | CABLE NUMBER | DESTINATION |
| 1 | AAB001 | AAB | A-001 |
| 2 | AAB002 |  | A-001 |
| 3 | AAB003 |  | A-001 |
| 4 | AAB004 |  | A-001 |
| 5 | AAC001 | AAC | A-001 |
| 6 | AAC002 |  | A-001 |
| 7 | AAC003 |  | A-001 |
| 8 | AAC004 |  | A-001 |

FIG. 30

| TERMINAL BLOCK NUMBER : A-001 | | | | |
|---|---|---|---|---|
| TERMINAL NUMBER | WIRE NUMBER | CABLE NUMBER | TIME OF FINISH | CONNECTION RESISTANCE (Ω) |
| 1 | AAB001 | AAB | 2009/3/9 14:24 | 1.23 |
| 2 | AAB002 | | 2009/3/9 14:24 | 1.01 |
| 3 | AAB003 | | 2009/3/9 14:25 | 2.01 |
| 4 | AAB004 | | 2009/3/9 14:25 | 1.33 |
| 5 | AAC001 | AAC | 2009/3/9 14:32 | 1.45 |
| 6 | AAC002 | | UNFINISHED | UNINTENTIONAL DISCONNECTION |
| 7 | AAC003 | | UNFINISHED | GROUNDED CONNECTION |
| 8 | AAC004 | | 2009/3/9 14:32 | 1.01 |
| TERMINAL BLOCK NUMBER : B-003 | | | | |
| TERMINAL NUMBER | WIRE NUMBER | CABLE NUMBER | TIME OF FINISH | CONNECTION RESISTANCE (Ω) |
| 1 | AAB001 | AAB | 2009/3/9 14:24 | 1.23 |
| 2 | AAB002 | | 2009/3/9 14:24 | 1.01 |
| 3 | AAB003 | | 2009/3/9 14:25 | 2.01 |
| 4 | AAB004 | | 2009/3/9 14:25 | 1.33 |
| 5 | AAC001 | AAC | 2009/3/9 14:32 | 1.45 |
| 6 | AAC002 | | UNFINISHED | UNINTENTIONAL DISCONNECTION |
| 7 | AAC003 | | UNFINISHED | GROUNDED CONNECTION |
| 8 | AAC004 | | 2009/3/9 14:32 | 1.01 |

CABLE CONNECTION SUPPORT APPARATUS AND METHOD OF SUPPORTING CABLE CONNECTION

CLAIM OF PRIORITY

The present application claims priority from Japanese Patent application serial no. 2009-141788, filed on Jun. 15, 2009, the content of which is hereby incorporated by reference into this application.

BACKGROUND OF THE INVENTION

1. Technical Field

The present invention relates to a cable connection support apparatus and a method of supporting cable connection, and more particularly, to a cable connection support apparatus and a method of supporting cable connection, suitable for checking cable connections, and conducting continuity tests when connecting cables.

2. Background Art

According to the technology disclosed in Japanese Patent Laid-open No. 2007-279914, each end of two cables that have been connected is connected to form a loop, and a weak current is energized through the loop, thus, the continuity test within the two cables is carried out. Additionally, a cable-end RFID is attached to the cable end and the connection is confirmed by reading the ID information of the RFID. During the wire connection work, a worker is at each end of the cable, and communication between the two workers is made by the use of a communication means, such as wireless communication, other than wire communication. Further, information about the connected cable and ID information of the read RFID is sent to the work management center by the use of a communication means, such as wireless communication, other than wire communication, thereby confirming the cable connection conditions.

According to the technology disclosed in Japanese Patent Laid-open No. 2005-244615, inquiry instruction is transmitted from a superordinate apparatus to a subordinate apparatus by the use of the LAN wiring to obtain identification ID of the subordinate apparatus, thereby confirming the connection destination of the cable.

[Prior Art Literatures]
[Patent Literatures]
Patent Literature 1: Japanese Patent Laid-open No. 2007-279914
Patent Literature 2: Japanese Patent Laid-open No. 2005-244615

SUMMARY OF THE INVENTION

Problem for Solving by the Invention

In the system disclosed in Japanese Patent Laid-open No. 2007-279914, the following three issues exist. 1. When checking the electric continuity, the worker at each end of the cable must work together to select the cable while closely communicating with each other. Accordingly, at least two workers are required for both ends of the cable. 2. For the communication between the two workers and the communication between two apparatuses located on both ends of the cable, a communication means other than the connected cable is used. Therefore, in some cases, communication may not be possible in such locations as the inside of the building enclosed by walls of reinforced-concrete that shields a radio wave. Also, if wire communication is utilized, there is a need for laying a new cable for communication in addition to the connected cable. 3. Selecting the cable to be checked and reading the RFID are conducted visually and manually. Accordingly, a human error may occur.

Furthermore, the method disclosed in Japanese Patent Laid-open No. 2005-244615 can be used only when cables are standardized, connections between the multi-wire cable (usually eight wires for a LAN cable) and the connectors attached to both ends of the cable are secured, and intercommunication between the superordinate apparatus and the subordinate apparatus is ensured. Therefore, it is not possible to check each wire inside a cable.

An object of the present invention is to provide a cable connection support apparatus and a method of supporting cable connection, by which connection condition of each wire in a cable can be checked.

Means for Solving the Problems

The present invention for achieving the above object is characterized in that a master apparatus is attached to one end of a wire of a laid cable, and a slave apparatus is attached to another end of the wire, wherein the master apparatus has a apparatus for checking position on the slave apparatus to which the wire of the laid cable is connected. Communication between the master apparatus and the slave apparatus necessary for the checking of the wire is conducted via the cable wire being checked only.

ADVANTAGEOUS EFFECT OF THE INVENTION

According to the present invention, the connection condition of each wire in a cable can be checked.

BRIEF DESCRIPTION OF THE DRAWINGS

FIG. 13 is an explanatory drawing showing a method for attaching a master apparatus shown in FIG. 12.

FIG. 15 is an explanatory drawing showing an example of a database on a master-apparatus side according to embodiment 2.

FIG. 16 is an explanatory drawing showing an example of a database on a slave-apparatus side according to embodiment 2.

FIG. 30 is an explanatory drawing showing an example of a work progress database.

DETAILED DESCRIPTION OF THE PREFERRED EMBODIMENTS

Embodiment of the present invention will be explained in detail with reference to drawings. A single-wire cable is a cable in which one conducting wire is coated with isolation sheath, and a multi-wire cable is a cable in which a plurality of conducting wires are coated with isolation sheath. Each conducting wire included in a cable is described as a cable wire.

[Embodiment 1]

Figure 2:
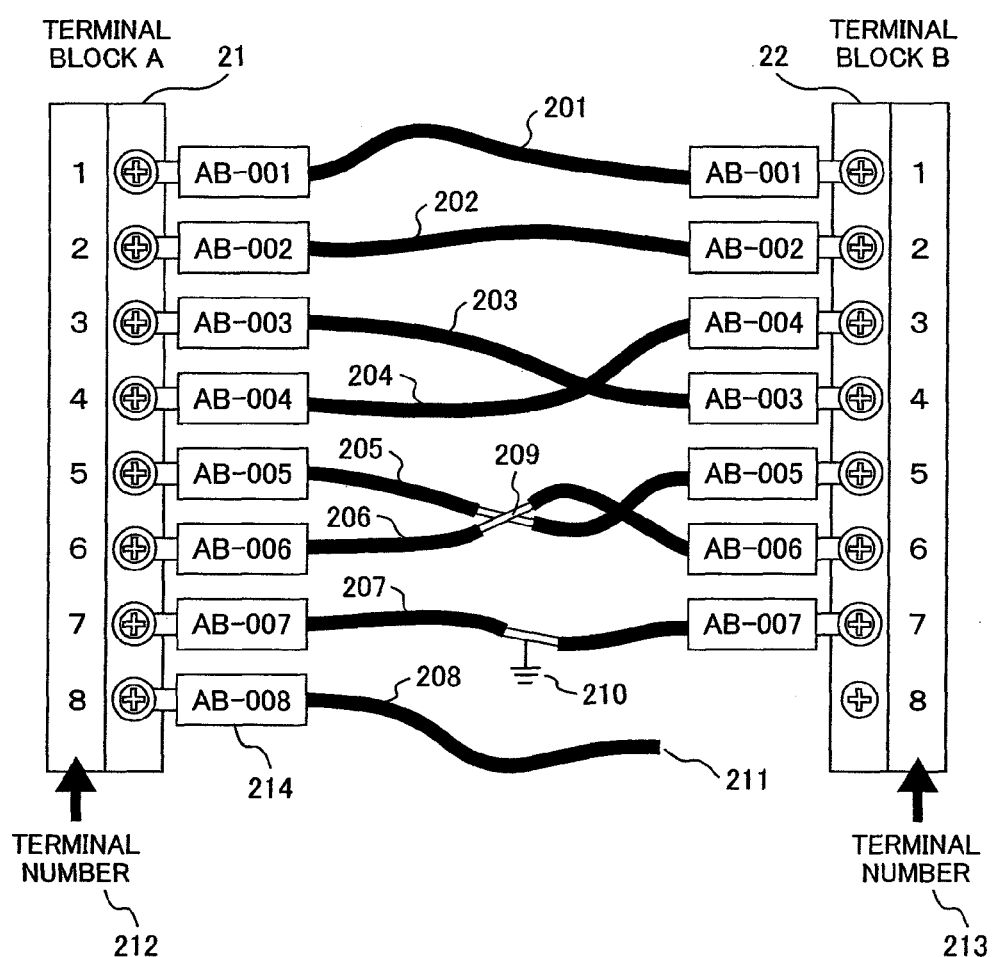
FIG. 2 is an explanatory drawing showing an example of wire connection work.

A cable connection support apparatus according to embodiment 1, which is a preferred embodiment of the present invention, will be explained below. FIG. 2 shows an example of cable connections. In this example, cables are connected from a terminal block A 21 to a terminal block B 22. Those terminal blocks are connected by eight single-wire cables 201 to 208. Terminal number 212 and terminal number 213 are assigned to those terminal blocks, respectively. Furthermore, numbers from 1 to 8 are assigned to each terminal block. Also, a cable ID 214 is assigned to each single-wire cable. However, FIG. 2 shows an example of improper cable connections where the terminals having the same number on both terminal block A and terminal block B were originally intended to be connected by each cable, however, due to connection errors or the like, cables except for single-wire cables 201 and 202 are not properly connected. Examples of improper cable connections will be described below.

1. Example of Improper Connection

This is an example where due to a connection error, single-wire cable 203, which is connected to terminal the number 3 of terminal block 21 (terminal block A), is connected to the terminal number 4 of terminal block 22 (terminal block B), and single-wire cable 204, which is connected to the terminal the number 4 of terminal block 21, is connected to the terminal number 3 of terminal block 22 (improper connection).

2. Example of Inter-continuity

This is an example where single-wire cable 205 and single-wire cable 206 are connected to proper terminals, but those cables happened to come in contact with each other at a position 209 due to isolation damage (inter-continuity).

3. Example of Grounded Connection

This is an example where the single-wire cable 207 has come in contact with a ground 210 due to cable damage (grounded connection).

4. Example of Unintentional Disconnection

This is an example where the single-wire cable 208 has been unintentionally left unconnected at the cable end 211 (unintentional disconnection).

Thus, several types of connection errors can possibly occur in a cable connection. Conventionally, cable inspectors were located on both ends of the cable after the connections had been made and they checked each cable connection by the use of headsets and bells. Such connection test is operations that require a large number of man-hours, and inspection errors made by inspectors occurred once in a while. A first purpose of the present embodiment is to find the above-mentioned "improper connection", "inter-continuity", "grounded connection", and "unintentional disconnection".

Figure 1:
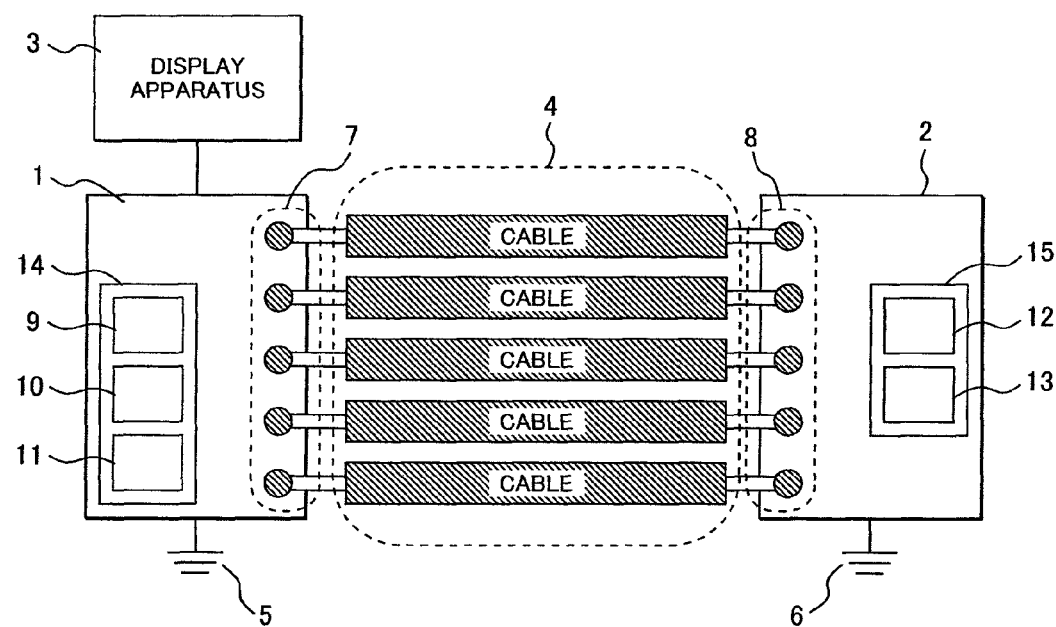
FIG. 1 is a structural diagram showing a cable connection support apparatus according to embodiment 1, which is a preferred embodiment of the present invention.

FIG. 1 shows a structural example of a cable connection support apparatus being used in the embodiment 1. A master apparatus 1 and a slave apparatus 2 are disposed on both ends of a plurality of cables 4, wherein each cable is connected to the master apparatus 1 by a master-apparatus-side terminal block 7 and the slave apparatus 2 by a slave-apparatus-side terminal block 8. Also, the master apparatus 1 and the slave apparatus 2 are grounded by means of a master-apparatus-side grounding 5 and a slave-apparatus-side grounding 6, respectively. Herein, the grounding can be grounding to the ground or grounding to an automobile body or a chassis when the automobile body or chassis is made of metal. Furthermore, the grounding can be grounding to an electrically-connected cable or an electric conductor. The master apparatus 1 makes, for each connected cable, an inquiry about that the cable is connected to any terminal of the slave apparatus 2 and inspects for inter-continuity, grounded connection, and unintentional disconnection. Connection destinations and inspection results are displayed by a display apparatus 3. Both the master apparatus 1 and the master apparatus 2 have control circuits 14 and 15, respectively. As details will be hereinafter described, the control circuit 14 comprises a scanning apparatus 9, resistance measuring apparatus 10, and an ID receiving apparatus 11, and the control circuit 15 comprises a scanning apparatus 12, and an ID transmitting function apparatus 13.

Figure 5:
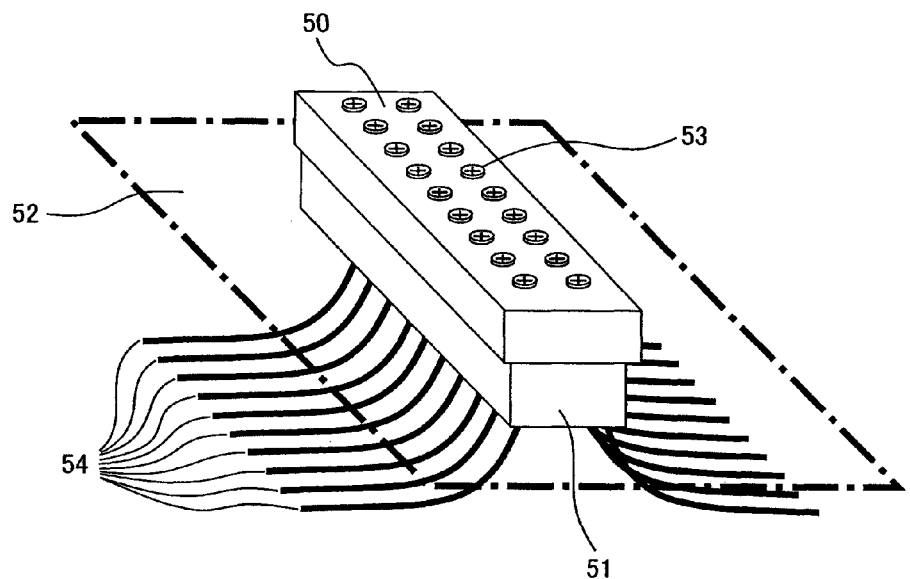
FIG. 5 is a perspective view showing an example of a connector-type terminal block.
Figure 6:
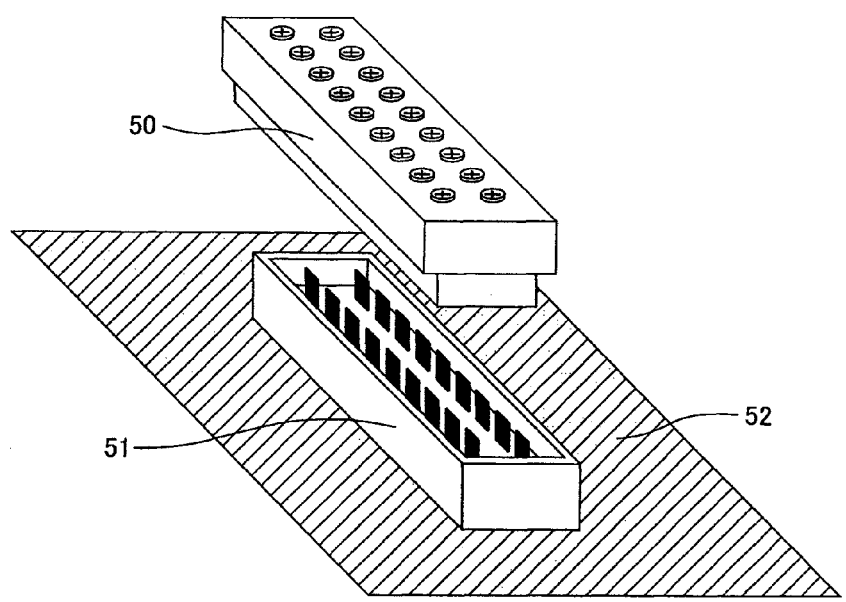
FIG. 6 is an explanatory drawing showing a state in which a connector-type terminal block shown in FIG. 5 has been detached from a connector.
Figure 7:
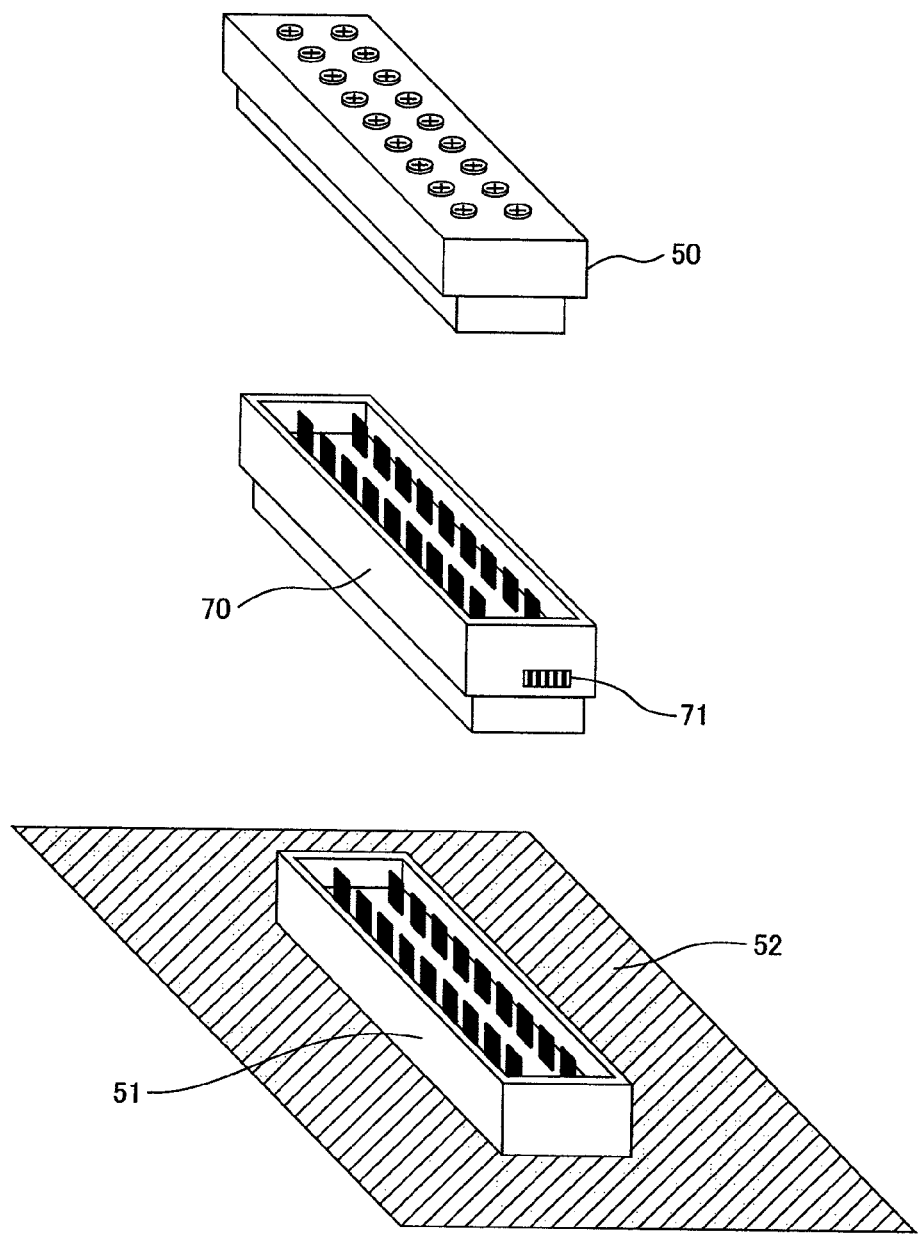
FIG. 7 is an explanatory drawing showing a method for attaching a master apparatus shown in FIG. 1.
Figure 8:
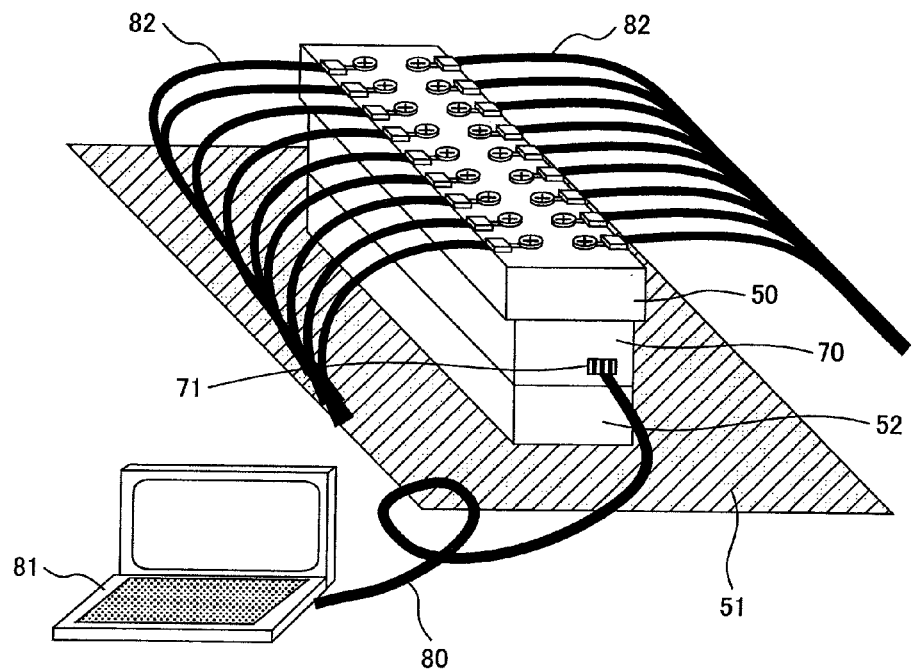
FIG. 8 is a schematic diagram showing a state in which a master apparatus is in operation.
Figure 9:
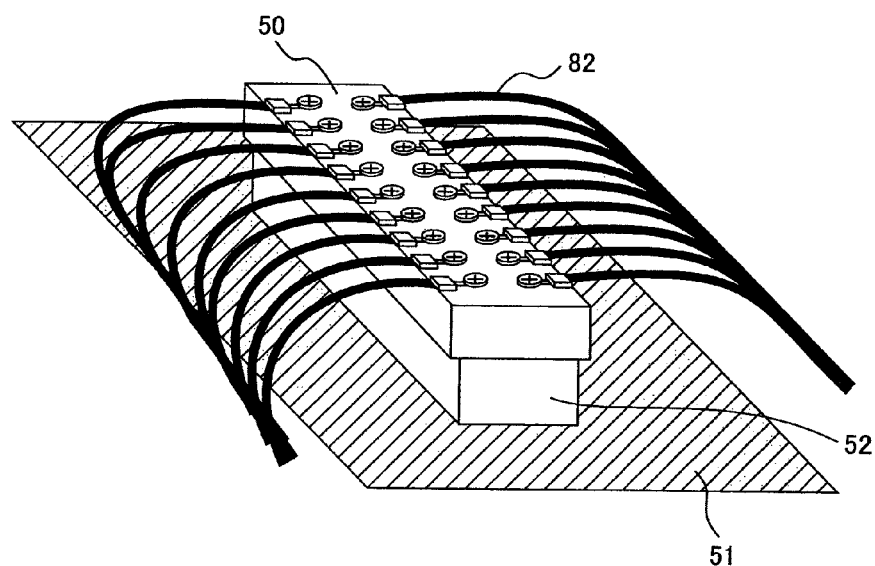
FIG. 9 is a schematic diagram showing a connector-type terminal block after wire connection work has been finished.

Appearance of the master apparatus 1 and the slave apparatus 2 will be described with reference to FIG. 5, FIG. 6, FIG. 7, FIG. 8, and FIG. 9. FIG. 5 shows an example of a connector-type terminal block. There are provided a fixed panel 52 for the terminal block, a connector 51 mounted to the fixed panel 52, a terminal block 50 connected to the connector 51, and a plurality of terminals 53 mounted to the terminal block 50. Wires 54 are connected to the lower portion of the connector 51 and also connected to the wires disposed in the fixed panel 52. The terminal block 50 has a structure that is connected to the connector 51. The terminal block 50 can be easily detached from the connector 51 as shown in FIG. 6. Conventionally, wires were connected to the terminals 53 disposed on the terminal block 50 in the condition shown in FIG. 5. FIG. 7 shows the condition in which the master apparatus 1 and the slave apparatus 2 are mounted. Appearance of the master apparatus 1 is shown as a master apparatus 70. Also, there is provided a communication connector 71 to connect to the display apparatus 3. As shown in FIG. 8, the master apparatus 70 is inserted between the terminal block 50 and the connector 51 and used. FIG. 8 shows connected single-wire cables 82 and a display apparatus 81 (a personal computer is used in the present embodiment), and the display apparatus 81 is connected to the connector 71 by a connecting cable 80 for both communicating with the display apparatus 81 and supplying power. An USB cable can be exemplified as the connecting cable 80. By using an USB cable, power supply to the master apparatus 70 and data communication with the display apparatus 81 can be conducted by the same cable. In the condition shown in FIG. 8, terminal positions of the master apparatus 70 are electrically connected in pairs to the terminals of the terminal block 50, thereby making it possible to reliably transmit the signal from a single-wire cable 82 connected to the terminal block 50 to the same terminal position of the master apparatus 70. Moreover, the connector 52 is not electrically connected to the master apparatus 70. After the cable connections have been checked, as shown in FIG. 9, the master apparatus 70 is detached and the terminal block 50 is connected to the connector 52 again, finishing the procedure. Appearance of the slave apparatus 2 is the same as that of the master apparatus 70, therefore, a description illustrated by drawings will be omitted.

Next, operation details of the master apparatus 1 and the slave apparatus 2 will be described using FIG. 3 and t FIG. 4. A circuit shown in FIG. 3 has a master-apparatus side 328 in a right side of cables 301 of the cable portion as the boundary, and a slave-apparatus side 327 in a left side of the cables 301. The master-apparatus side 328 is a part of the master apparatus 1, and the slave-apparatus side 327 is a part of the slave apparatus 2. There are provided a terminal block 303 of the master-apparatus side 328 and a terminal block 302 of the slave-apparatus side 327. This circuit is configured such that terminals of the master-apparatus side 328 and terminals, which are connected thereto through the cables 301, of the slave-apparatus side 327, are searched by using a scanning circuit S 304 and by controlling switch SW2n by a scanning circuit M 305, the search results are coded using a switch 314, indicated as SW3, and the coded results are detected by a differential voltage detection circuit 308 of the master-apparatus side 328. Furthermore, the slave apparatus 2 is operated by the power supplied from the master apparatus 1 through a connecting cable 4 (the cables 301 in FIG. 3). Therefore, since all of the control is executed in the master-apparatus side 328 (the master apparatus 1), there is no need for an inspector to be located on the slave apparatus side 327 (the slave apparatus 2). Accordingly, it is unnecessary to have a worker on the slave apparatus side 327. Moreover, there is no need for laying a new cable for communication. Also, it is possible to prevent human errors.

Hereafter, a method of supporting cable connection of the present embodiment will be explained according to a procedure shown in FIG. 4 with reference to FIG. 3.

Figure 3:
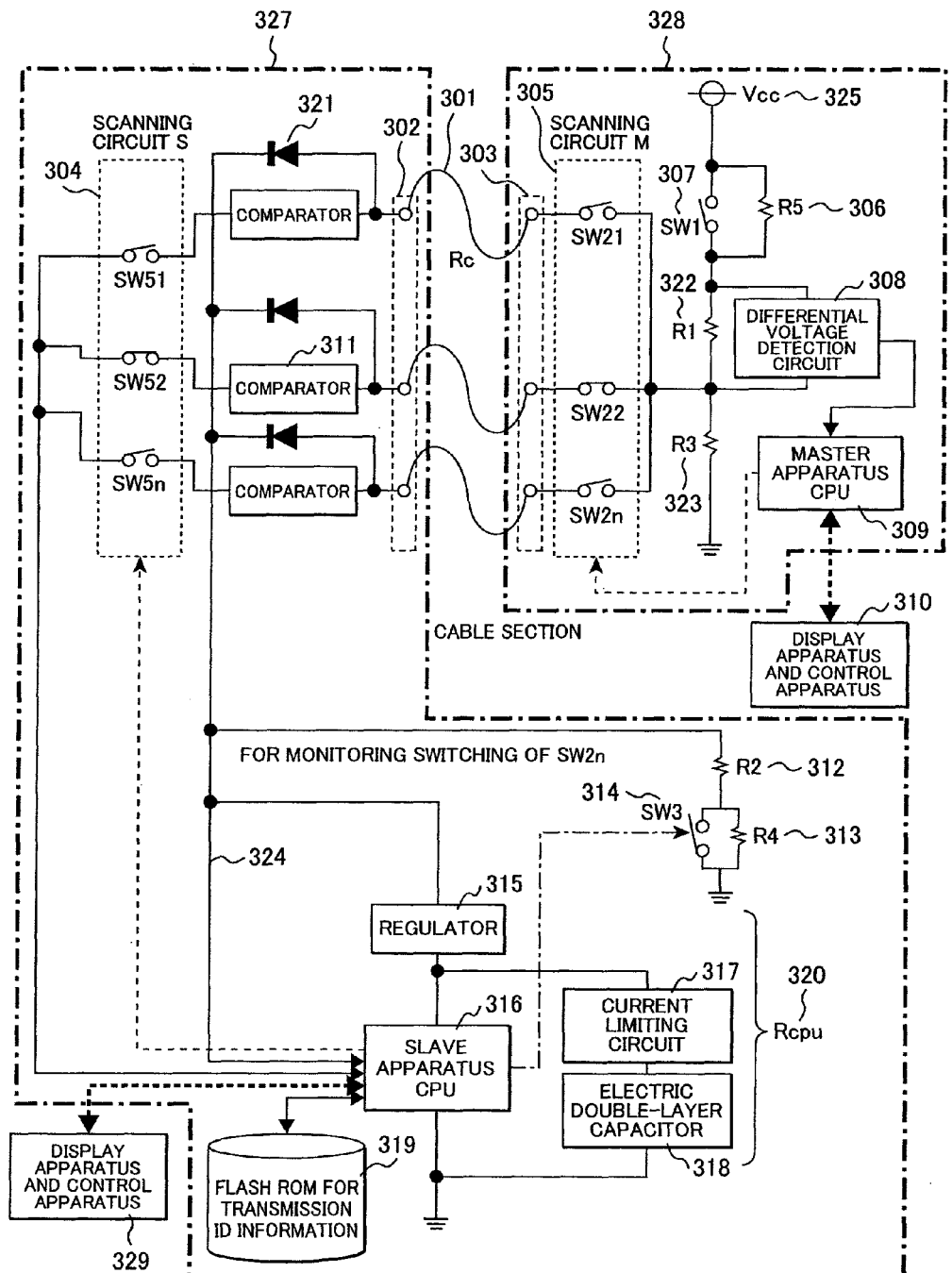
FIG. 3 is a detail structural diagram showing a cable connection support apparatus shown in FIG. 1.
Figure 4:
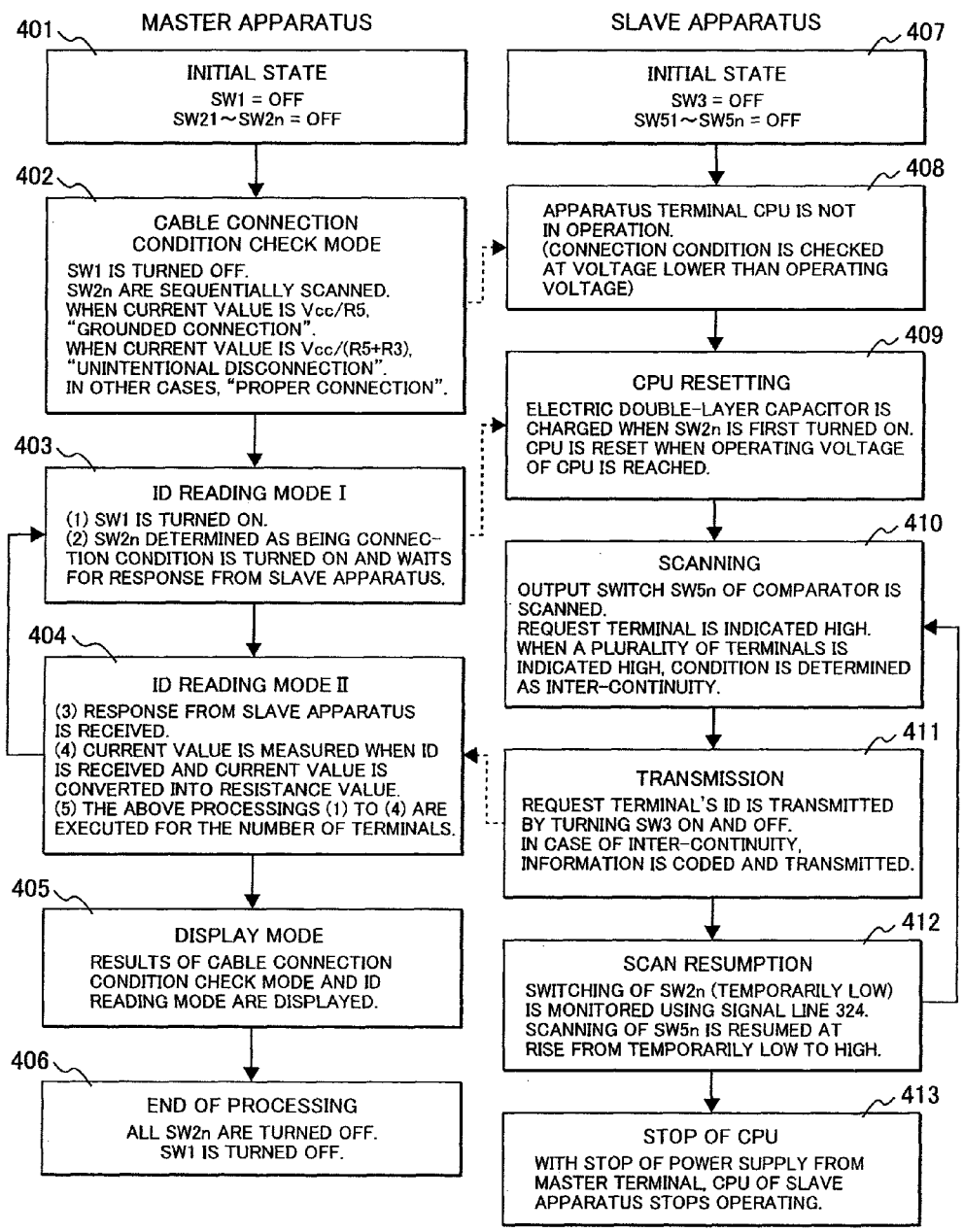
FIG. 4 is a flowchart showing a processing of a cable connection support apparatus shown in FIG. 3.

In an example of a resistance value of each resistor shown in FIG. 3, a resistor R1 is $0.01\Omega$, a resistor R2 is $50\Omega$, a resistor R3 is $100\,k\Omega$, a resistor R4 is $10\,k\Omega$, and a resistor R5 is $100\,k\Omega$. In initial state, the master apparatus 1 become an initial state 401 and the slave apparatus 2 become an initial state 407 as shown in FIG. 4.

First, the master apparatus 1 checks the cable connection condition of the cables 301 in a cable connection condition check mode 402. In this mode, the "grounded connection" and the "unintentional disconnection" are checked. In a state that a switch 307, indicated as SW1, is turned off, switches SW21 to SW2n are sequentially turned on, one switch at a time. When the switch 307 is turned off, current supplied from Vcc 325 flows through a resistor 306, indicated as R5. Additionally, the potential difference between both ends of shunt resistor R1 is detected by the differential voltage detection circuit 308, and current flowing through the resistor R1 (current provided by Vcc 325) can be detected according to the potential difference.

When the cable has the "grounded connection", grounding is made with resistance significantly smaller than the resistance value of a resistor R3 and the resistance of R3 is ignored, accordingly, the current value is detected as Vcc/R5. Therefore, this condition can be determined that the cable has a grounded connection.

When the cable is the "unintentional disconnection", only current flowing through the resistor R3 exists. Therefore, if the current value is Vcc/(R5+R3), the condition can be determined as being the "unintentional disconnection" or "unconnected".

The condition other than the above is determined as being "proper connection".

Moreover, in the cable connection condition check mode 402, since voltage supplied to slave-apparatus side 327 is small, the CPU 316 of the slave-apparatus side 327 is not in operation (mode 408).

Next, an ID reading mode 1403 and an ID reading mode II 404 are executed. The ID reading mode is a mode where by reading ID information assigned to each terminal in the slave-apparatus side 327, it is read that the cable 301 connected to a terminal position of the master-apparatus side 328 is connected to any terminal position of the slave-apparatus side 327. The ID information can be a terminal number of the slave-apparatus side 327 or an ID that combines an individual ID of the terminal block, to which the slave apparatus 2 is connected, with the terminal ID. Also, in this mode, the "inter-continuity" is checked as well.

In the ID reading mode I 403, the switch SW1 is first turned on. Turning this switch on and also turning any one of the switch SW2n on, it possible to supply sufficient voltage to operate the CPU 316 from the master-apparatus side 328 to the slave-apparatus side 327 through the connecting cable 301.

Next, the switches SW2n that have been determined as being "proper connection" in the cable connection condition check mode 402 are sequentially turned on. When the switch SW2n is first turned on, a CPU resetting mode 409 in which charge of an electric double-layer capacitor 318 and reset of the CPU 316 of the slave apparatus 2 are conducted, is executed. The electric double-layer capacitor 318 is used to cope with temporary blackout that occurs due to switch the switch SW2n as well as to smooth power consumed by the CPU 316.

In the example shown in FIG. 3, a switch SW22 is turned on. Accordingly, the comparator 311 indicates High and other comparators 321 and the like, indicate Low. In the scanning mode 410, The CPU 316 of the slave apparatus 2 scans this condition by using the scanning circuit S 304 and detects the terminal position that indicates High. In this example, when a switch SW52 is turned on, the High condition can be detected, accordingly, it can be determined that a second terminal position from a top of the terminal block 302 is the terminal requested by the master apparatus 1.

Figures 10, 11:
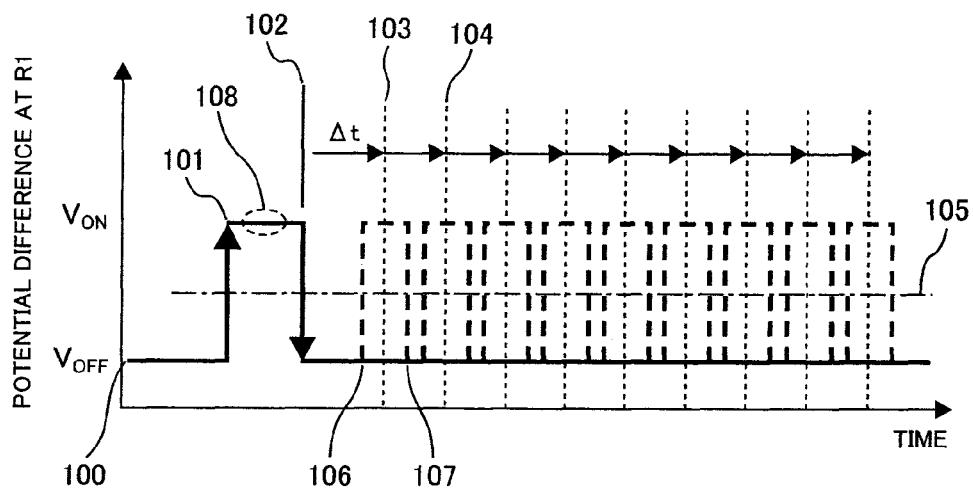
FIG. 10 is an explanatory drawing showing an example of voltage change.
FIG. 11 is an explanatory drawing showing an example of displaying inspection results.

Next, to execute a transmission mode 411, the CPU 316 selects ID information, which corresponds to the terminal position, from the transmission ID information flash ROM 319 and sends the ID information of the requested terminal by turning switch SW3 on and off. If the inter-continuity is detected, the status is coded and transmitted. The ID information is sent by turning on and off the switch 314 that is an SW3. By turning the switch on and off, voltages at both ends of the shunt resistor R1 of the master apparatus 1 is changed as shown in FIG. 10. In the ID reading mode II 404, utilizing the voltage change, the master-apparatus side 328 receives the ID information. After that, in the display mode 405, execution results of the cable connection condition check mode and the ID reading modes 403 and 404 are displayed on the display apparatus 3. Subsequently, a processing end mode 406 is executed. Thus, the function to transmit the above ID according to a request made by the master apparatus 1 and the function to read the transmitted ID by the master apparatus and detect the connection conditions of the cable wire can be accomplished. Therefore, since all of the control is executed in the master apparatus side 328, it is unnecessary to locate an inspector on the slave apparatus side 327. Consequently, there is no need for a worker to be present on the slave apparatus side 327. Also, there is no need for laying a new communication cable. Human errors can also be prevented.

Figure 33:
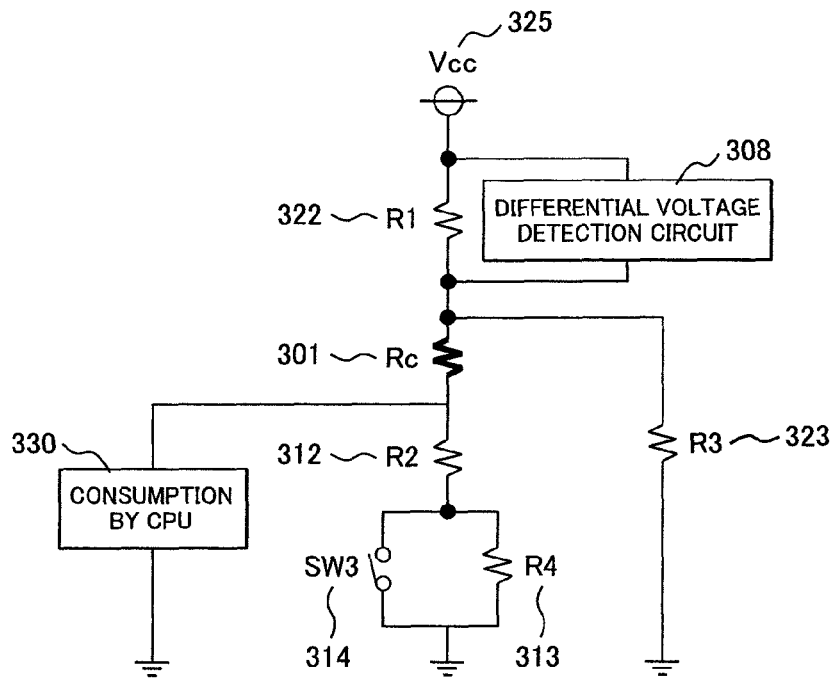
FIG. 33 is an explanatory drawing showing an example where a resistor portion has been retrieved from a circuit shown in FIG. 3.

The ID information transmission will be further described in detail. FIG. 33 shows a resistor portion retrieved from the circuit shown in FIG. 3. In the initial state of the ID reading mode, since the switch SW1 is turned on, a resistor 306, indicated as R5, is excluded. If an energy-saving type CPU 316 is used in this circuit, consumption current 330 is 1 mA or less (the converted resistance value in 3.3 V-operation is approximately 3.3 kΩ), and a resistor 323, indicated as R3, can be ignored because it has large resistance. Accordingly, a circuit that excludes those resistance values that can be ignored is shown in FIG. 34.

Figure 34:
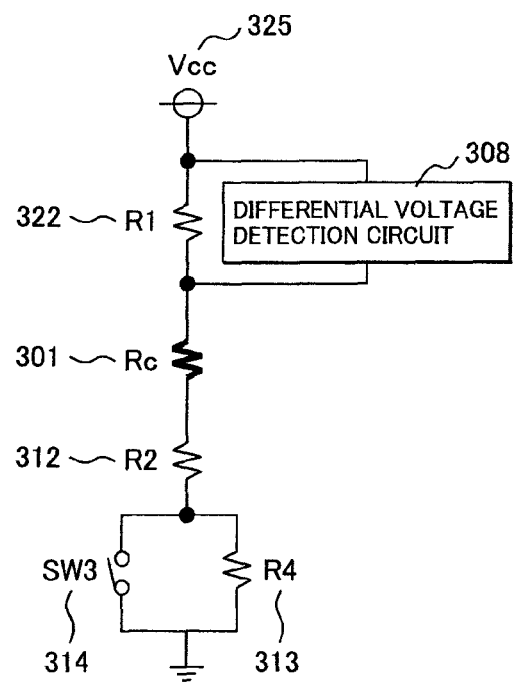
FIG. 34 is an explanatory drawing showing an example of a circuit diagram from which resistance values that can be ignored have been removed.

In the circuit shown in FIG. 34, potential difference $V_{OFF}$ between both ends of the resistor R1 in the condition that the switch SW3 is turned off is expressed by equation (1).

$$V_{OFF} = \frac{R1 \cdot Vcc}{R1 + Rc + R2 + R4} \quad (1)$$

Potential difference $V_{ON}$ between both ends of the resistor R1 in the condition that the switch SW3 is turned on is expressed by equation (2).

$$V_{ON} = \frac{R1 \cdot Vcc}{R1 + Rc + R2} \quad (2)$$

In the initial state, the switch SW3 is turned off. Accordingly, potential difference between both ends of the resistor R1 is $V_{OFF}$ 100 as shown in FIG. 10. Next, when the switch SW3 is turned on, potential difference between both ends of the resistor R1 becomes $V_{ON}$ 101. This potential difference can be detected by the use of the differential voltage detection circuit 308 and can also be coded with 0 and 1 using a threshold 105.

Data sampling can be executed as shown below.

(1) Data sampling in the differential voltage detection circuit 308 of the master apparatus 1 is executed starting from the first down edge 102 with a sampling interval of Δt. Accordingly, temporal positions of data sampling are as indicated as 103 and 104.

(2) The slave apparatus 2 operates the switch SW3 according to the code transmitted before time 106 earlier than Δt and time 107 earlier than 2 Δt on the basis of time 102 when the switch SW3 was first turned off. For example, when sending "1", the switch SW3 is turned on, and when sending "0", the switch SW3 remains turned off.

(3) Thereafter, the above procedures (1) and (2) will be repeated thereby transmitting information.

Thus, it is possible to detect the change of the switch SW3 (transmitted information) operated on the slave apparatus side 327 by checking the value of output from the differential voltage circuit 308 of the master apparatus 1.

Furthermore, resistance values of the resistors R1 and R2 other than the resistance value Rc of the cable 301 have been known. Therefore, resistance value Rc of the cable 301 can be obtained from the voltage drop of the resistor R1.

The resistance value of the cable 301 can be obtained as shown below.

(4) Measuring the voltage $V_{ON}$ in the zone where the first switch SW3 is turned on (e.g., the zone from time 101 to time 102)

(5) The resistance value Rc of the cable 301 can be obtained from the voltage $V_{ON}$ by equation (3).

$$Rc = \frac{R1 \cdot Vcc}{V_{ON}} - R1 - R2 \quad (3)$$

Although the resistance value of Rc of the cable 301 is obtained from $V_{ON}$ by equation (3), the resistance value of Rc of the cable 301 can be obtained in the same manner by using $V_{OFF}$.

Furthermore, if a plurality of terminals are found to be High when scanning is executed by the use of the scanning circuit S 304, cables connected to those terminals are connected to one another, thus, the condition can be determined as "inter-continuity".

In a scanning resumption mode 412, after ID information has been transmitted, one switch SW2n that is ON-state is once turned off and then the next switch SW2n is be turned on. At this point in time, since the power supplied from the master apparatus 1 is temporarily disconnected, the CPU 316, which is connected to a signal line 324, of the slave apparatus 2 detects the end of the transmission of the ID information and resumes the scanning of the switch SW5n. Subsequently, in a CPU stop mode 413 of the slave apparatus 2, when the power supply from the master apparatus 1 is stopped, the operation of the slave apparatus 2 is stopped.

When all of the above processing of each mode were executed, the method of supporting cable connection of the present embodiment is completed.

A display apparatus and control apparatus 310 connected to a CPU 309 of the master apparatus 1 includes the control circuit 14 and the display apparatus 3 shown in FIG. 1. A display apparatus and control apparatus 329 connected to a CPU 316 of the master apparatus 1 includes the control circuit 15 shown in FIG. 1 and the display apparatus not shown in FIG. 1. Inspection results are displayed on a display screen of the display apparatus and control apparatus 310. To take an example, FIG. 11 shows a display example in which the connection conditions shown in FIG. 2 exist. In the display example shown in FIG. 11, the "inter-continuity", "grounded connection", and "unintentional disconnection" can be read. Furthermore, with regard to the "improper connection" of the cables 301, when an inspector visually checks and compares the connections with the connection diagram of the cables 301 at the master-apparatus side 328, the inspector can determine that the terminal number 3 and terminal number 4 are reversely connected. The display apparatus and control apparatus 310 of the master-apparatus side 328 and the display apparatus and control apparatus 329 of the slave-apparatus side 327 can be used to instruct the position of cable wire to the terminal block, which will be described later, in addition to display the above-mentioned inspection results.

According to the present embodiment, it is unnecessary to locate an inspector to the slave-apparatus side 327, and cable connections can be inspected without using a communication means other than the connecting cable 301. Furthermore, cable connections can be checked by simply using the existing cable 301, and it is unnecessary to provide a new communication means.

Figure 19:
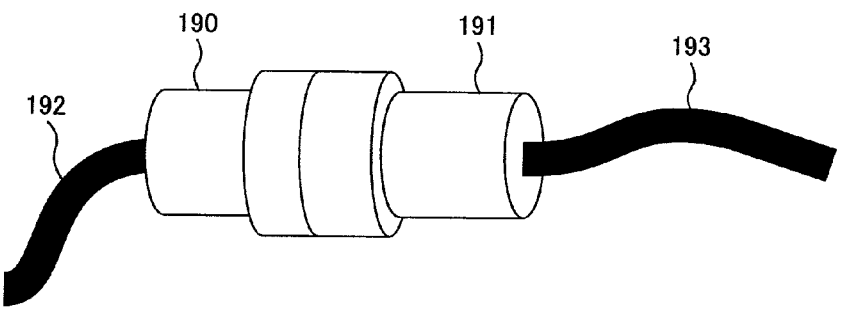
FIG. 19 is an explanatory drawing showing an example of a connector which is used in embodiment 1.
Figure 20:
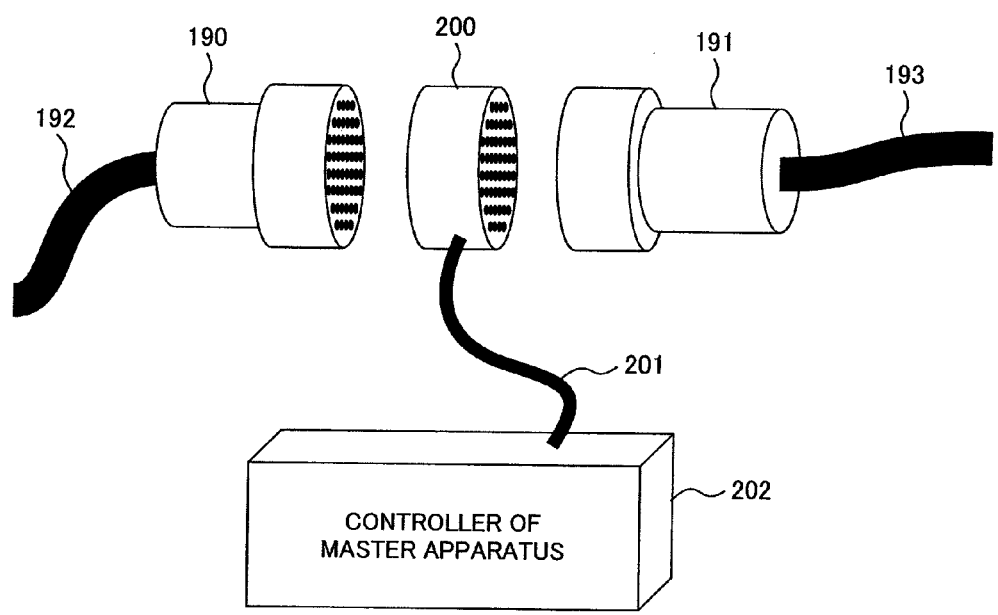
FIG. 20 is an explanatory drawing showing an example of a state in which a controller of a master apparatus is attached to a connector shown in FIG. 19.

In the present embodiment, the connector-type terminal block 50 mounted to the fixed panel 52 is used, however, a master apparatus or a slave apparatus having a shape that can be inserted between the connectors present in the middle of the cable, may be used. FIG. 19 shows an appearance of intermediate connectors. The connectors 190 and 191 being the intermediate connectors are connected to each other, a multi-wire cable 192 is electrically connected to the intermediate connector 190, and a multi-wire cable 193 is electrically connected to the connector 191. FIG. 20 shows a condition in which the master apparatus is mounted to the intermediate connectors. The controller 202 of the master apparatus 1 is connected to a connector 200 inserted between the connector 190 and the connector 191 by a cable 201. The connecting cable 201 transmits a control signal of the controller 202 to the connector 200. When the slave apparatus 2 is connected to an end of the multi-wire cable 193, the connection condition of the cable 193 is inspected in a condition that the connector 200 is detached from the connector 190 and the connector 200 is connected to the connector 191, and when the slave apparatus 1 is connected to an end of the cable 192, the connection condition of the cable 192 is inspected in a condition that the connector 200 is detached from the connector 191 and the connector 200 is connected to the connector 192. Moreover, in FIG. 20, the master apparatus 2 is connected to the connector 200, however, if the slave apparatus 2 is connected to the cable 200, the inspection of the connection condition of the cables 192 and 193 connected to the master apparatus 1 can be executed in a like manner. Thus, by using an inspection connector 200 having a shape that conforms to the intermediate connectors connected to the cable, it is possible to utilize the present embodiment for a cable connected by connectors.

Consequently, the present embodiment can be applied to the connector such as a multi-wire cable or the like that can be connected at a time.

Figure 21:
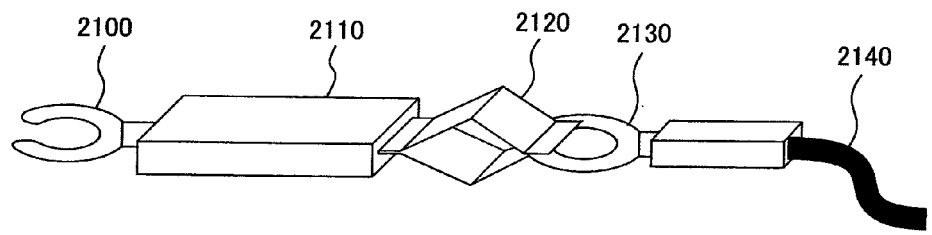
FIG. 21 is an explanatory drawing showing an example of one terminal connected to an inspecting cable.
Figure 22:
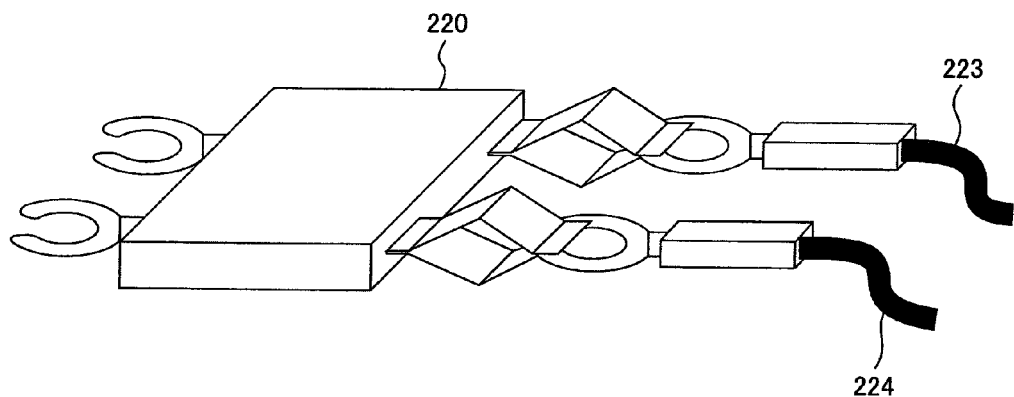
FIG. 22 is an explanatory drawing showing an example of two terminals connected to an inspecting cable.

FIGS. 21 and 22 show the condition in which each terminal is attached to the master apparatus or the slave apparatus. FIG. 21 shows an example of one terminal, and FIG. 22 shows an example of two terminals. In examples shown in FIG. 13 and FIG. 20, the use of standardized connectors and terminal blocks is the prerequisite for the use of this embodiment. Therefore, to conform to various connecting methods, these terminals are a means to connect each terminal to the master apparatus or the slave apparatus.

The cable 2140 shown in FIG. 21 is a cable being a check object. A terminal 2130 is mounted to the cable 2140. A clip 2120 temporarily connects to the terminal 2130. A slave apparatus 2110 includes the circuit of the slave apparatus 2. A terminal 2100 is a terminal to be temporarily connected to the terminal to which the terminal 2130 is intended to be connected. When a slave apparatus 2110 shown in FIG. 21 is used, the number of slave apparatuses 2110 of the same shape is the same as that of the connected cables. Therefore, to avoid inspection errors of the cable connection, the terminal 2100 is connected to the terminal to which the cable 2140 is intended to be connected, by using the terminal 2100.

In a similar way, FIG. 22 shows an appearance of the slave apparatus 220 having two terminals to inspect two cables 223 and 224 at the same time. The cables 223 and the cable 224 are a check object. The slave apparatus 220 includes the circuit of the slave apparatus 2. Moreover, FIG. 22 shows an example of two terminals, however, the number of terminals of the slave apparatus may be increased. Furthermore, FIGS. 21 and 22 show an example of a slave apparatus, however, the application and the appearance of the master apparatus is the same and a description will be omitted.

Thus, this example can be applied to connectors other than the standardized connectors.

Figure 23:
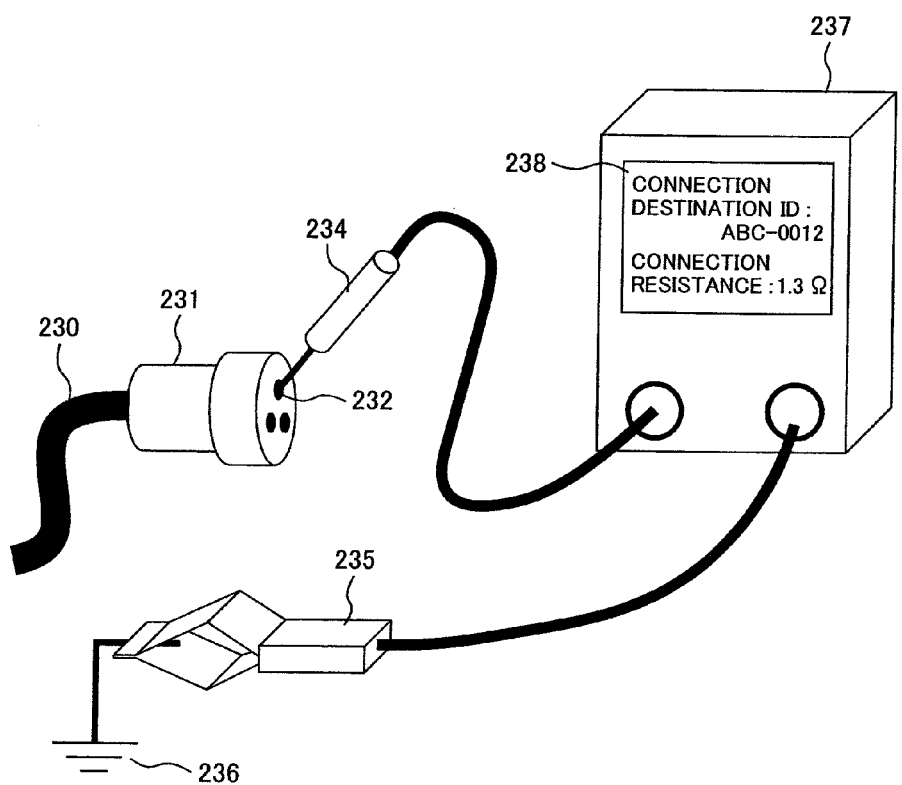
FIG. 23 is a structural diagram showing an apparatus for manually checking terminal connection.

In the descriptions of embodiments shown heretofore, the master apparatus electrically scans the terminals to check the connection condition. FIG. 23, however, shows an example in which the master apparatus is manually connected to a connector connected to a cable to check the connection condition. An apparatus shown in FIG. 23 is provided with a master apparatus 237 having a display showing inspection results, a clip 235 connected to the master apparatus 237, and a probe 234 connected to the master apparatus 237. The probe 234 is used for a worker to connect it to the terminal 232 of the connector 231 being a check object. The grounding terminal 236 is grounded. The clip 235 is used for connecting the master apparatus 237 to the grounding terminal. The slave apparatus 2 is connected to an end of the cable 230.

The worker contacts the probe 234 with each terminal of the connector 231. Then, the terminal ID of the slave apparatus as a response signal is sent from the slave apparatus connected to the end of the cable 230 to the master apparatus 237. The master apparatus 237 measures the resistance value of the connecting cable 230 based on the voltage change of the response signal and displays this measured value on the display apparatus 238. The worker checks the cable connection while looking at the responded connection destination ID information and the resistance value.

Heretofore, though the various master apparatus and slave apparatus were described, these apparatuses may be selected according to the applied location when applying this embodiment. For example, it is possible to use a slave apparatus having a shape illustrated in FIG. 7 and a master apparatus having a shape illustrated in FIG. 23.

According to the present embodiment, it is unnecessary to locate a worker on the slave apparatus side and labor costs can be reduced. Furthermore, cable connections can be checked by simply using existing cables, and it is unnecessary to provide a new communication means. Furthermore, replacement of cable wires is conducted by an electronic scanning method. Therefore, it is possible to prevent the occurrence of human errors.

[Embodiment 2]

In embodiment 1, the "inter-continuity", "grounded connection" and "unintentional disconnection" are automatically detected. However, with regard to the "improper connection", it is necessary for an inspector to visually compare the connections with the connection diagram. Accordingly, in embodiment 2 described hereinafter, which is another embodiment, the "improper connection" can be automatically detected. A cable connection support apparatus of the present embodiment will be described below with reference to FIG. 12.

Figure 12:
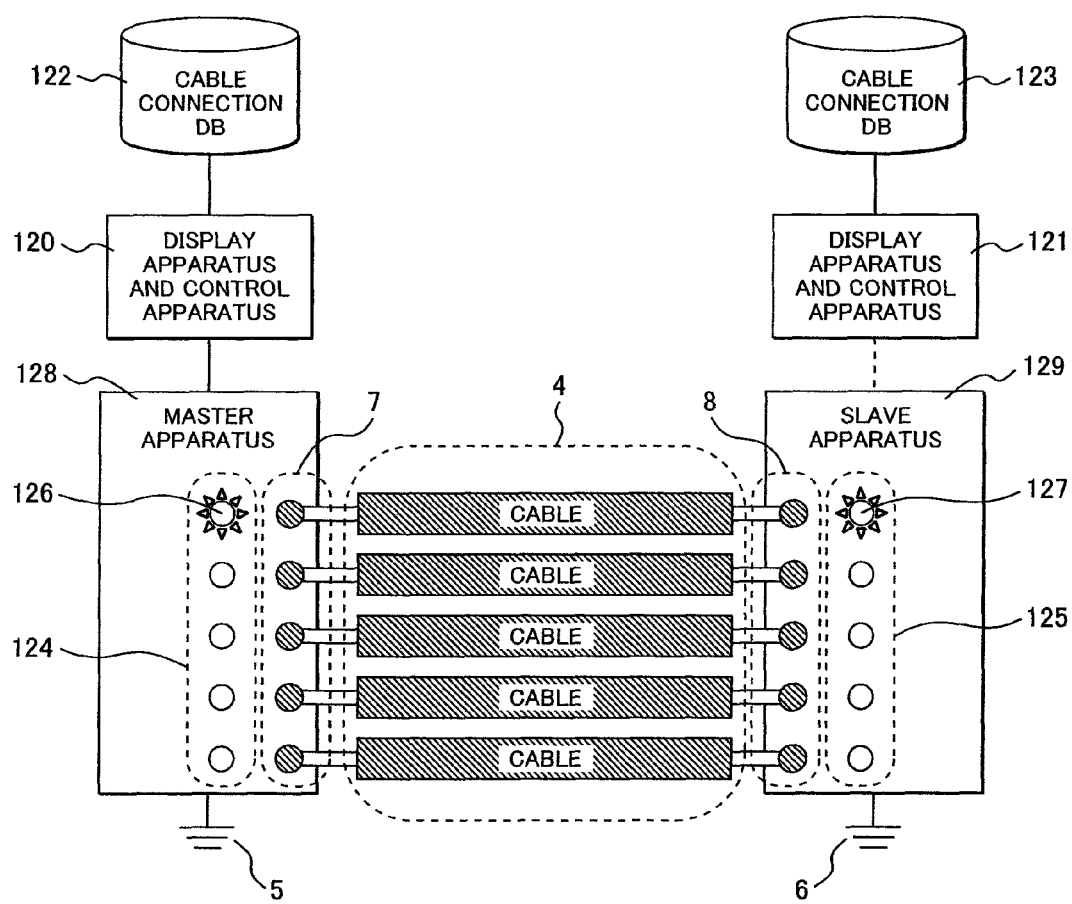
FIG. 12 is a structural diagram showing a cable connection support apparatus according to embodiment 2, which is another embodiment of the present invention.

FIG. 12 shows the cable connection support apparatus of the present embodiment. The cable connection support apparatus of the present embodiment has a structure in which a display apparatus and control apparatus 120 connected to a master apparatus 128, a cable connection DB 122 of the master-apparatus side, a display apparatus and control apparatus 121 connected to a slave apparatus 129, a cable connection DB 123 of the slave-apparatus side, a navigation LED group 124 of the master-apparatus side, and a navigation LED group 125 of the slave-apparatus side are added to the cable connection support apparatus of the embodiment 1 shown in FIG. 1. The cable connection support apparatus of the present embodiment has the master apparatus 128 as the master apparatus and the slave apparatus 129 as the slave apparatus.

The cable connection DB 122 of the master-apparatus side and the cable connection DB 123 of the slave-apparatus side register each information of wire connection diagrams, ID of the terminal block being used, and positions of the connecting terminals. The display apparatus and control apparatuses 120 and 121 check connection relationship of the cables between terminal blocks described in embodiment 1 by referring to the cable connection DBs 122 and 123, and navigate the position of the terminal block to be connected by using the navigation LED groups 124 and 125 by flashing each LED in such a manner as to flash a LED 126 of the master apparatus 128 and a LED 127 of the slave apparatus 129. Moreover, in the present embodiment, the cable connection DBs 122 and 123 are individually connected to the master apparatus 128 and slave apparatus 129, however, the cable connection DBs 122 and 123 may be the same data base DB as with a cable connection DB 252 shown in FIG. 25, described later. For example, before cable connection work starts, information stored in the cable connection DB 252 is copied to each DB of the cable connection DBs 122 and 123, then, the cable connection work is conducted, and if the information changes, the revised information can be registered in the cable connection DB 252 after the cable connection work has been completed. Further, it is possible to connect between the display apparatus and control apparatus 120 and the cable connection DB 252, and between the display apparatus and control apparatus 121 and the cable connection DB 252 by a wireless or wire communication apparatus, respectively and conduct direct communication between the cable connection DBs 120 and 121 and the cable connection DB 252.

Figure 14:
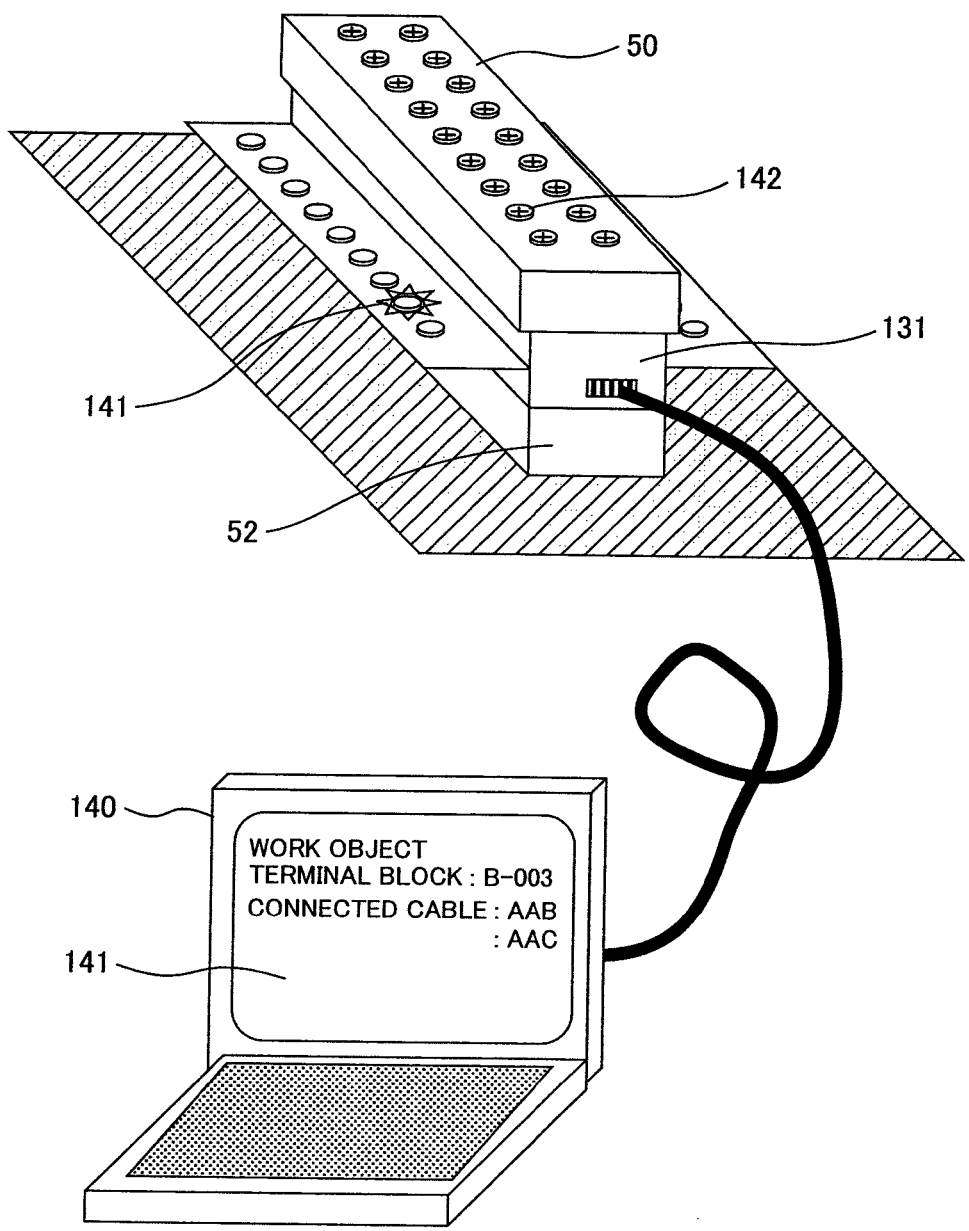
FIG. 14 is a schematic diagram showing a state in which a cable connection support apparatus shown in FIG. 12 is in use.

FIG. 13 shows an appearance of the master apparatus 128 and slave apparatus 129, respectively. Configuration of the internal circuit of the master apparatus 128 and that of the slave apparatus 129 is different as shown in FIG. 3, however, the appearance may be the same shape as a slave apparatus (or a master apparatus) 131 shown in FIG. 13. The slave apparatus (or the master apparatus) 131 has a navigation LED 132 and a connector 133 connected to the display apparatus and control apparatus 121 (or the display apparatus and control apparatus 120). The terminal block number 134 indicates identification information of the terminal block 50 and the terminal block number 135 indicate identification information of the connector 51. FIG. 13 shows an example of the terminal block of the slave apparatus shown in FIG. 16 and "B-003-C" being a terminal block number 134 and "B-003-P" being a terminal block number 135 are described. The "-C" and "-P" that follow "B-003" are extensions to identify a terminal block 50 and a terminal block 52 that form a pair. The terminal block number 134 and the terminal block number 135 are examples which indicate terminal block numbers that can be seen by the worker. However, instead of using the terminal block number, together with the terminal block number, a bar-code or RFID may be used. The actual use of the slave apparatus (or the master apparatus) 131 is shown in FIG. 14. The slave apparatus (or the master apparatus) 131 is used in a state that the slave apparatus (or the master apparatus) 131 was disposed between the terminal block 50 and the connector 51, and mounted to the terminal block 50 and the connector 51. A display apparatus and control apparatus 140 is connected to the slave apparatus (or the master apparatus) 131. The display apparatus and control apparatus 140 displays information of connected cables and wires, controls the flashing of the LED group 124 of the master apparatus 131 (or the LED group 125 of the slave apparatus), receives connection inspection result data, and displays the inspection results. FIG. 14 shows an example where the LED 141 is turned on. This is an example of instructions to connect the cable to a position of a terminal 142 that corresponds to the LED 141.

FIG. 15 shows an example of the information registered in the cable connection DB 122 of the master-apparatus side and FIG. 16 shows an example of the information registered in the cable connection DB 123 of the slave-apparatus-side. FIG. 15 shows the information about the terminal block 7 to which the master apparatus 128 is connected, and FIG. 16 shows the information about the terminal block 8 to which the slave apparatus 129 is connected. Each cable connection DB stores the number for the cable connected to a terminal block that corresponds to the terminal block number for identifying the applicable terminal block, and the wire number in the cable. Also, information corresponding between the wire number and the terminal number is registered. Conventionally, a worker who was engaged in wire connection work counted on the information shown in FIG. 15 and FIG. 16.

Figure 17:
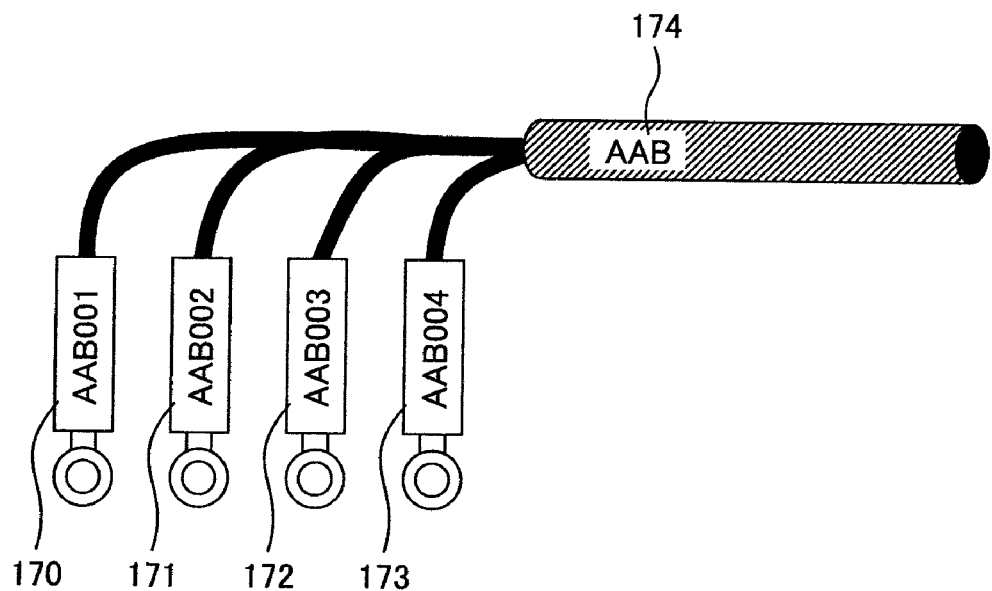
FIG. 17 is an explanatory drawing showing an example of a connecting cable according to embodiment 2.

FIG. 17 shows an example of a cable to be connected. A cable wire is provided with a mark tube 170 to 173 indicating a wire number and a cable marker 174 indicating a cable number. In addition to the character display that allows visual checking by using a mark tube and a cable marker, an RFID may be embedded or a bar code can be attached along with the character display. In this case, visual checking can reduce errors.

Figure 18:
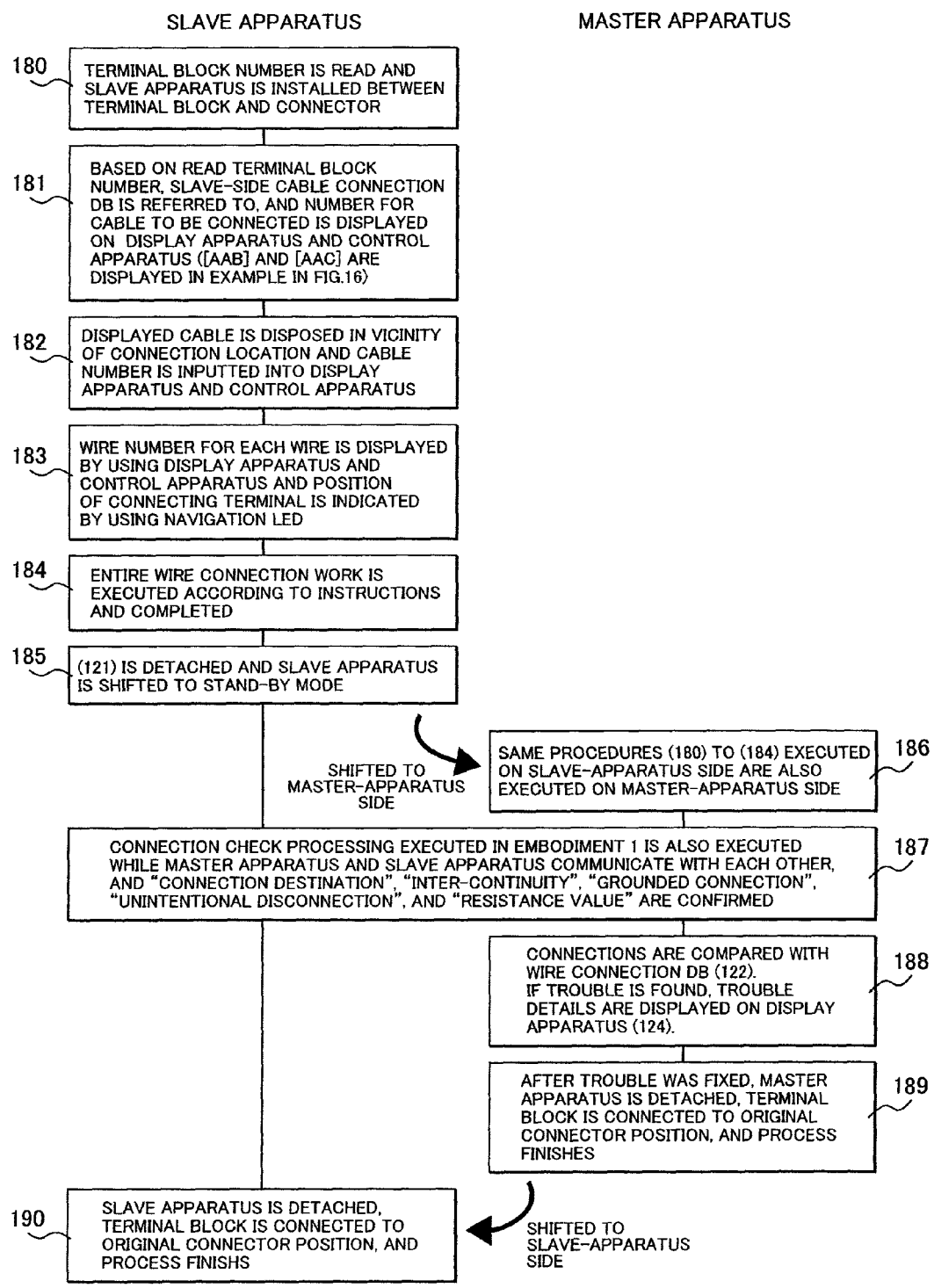
FIG. 18 is a flowchart showing a processing of a cable connection support apparatus shown in FIG. 12.

FIG. 18 shows the processing and work of the method of supporting cable connection conducted by using the cable connection support apparatus shown in FIG. 12. The method of supporting cable connection of the present embodiment will be described with reference to FIG. 18.

First, work is started on the side where the slave apparatus 129 is installed.

The terminal block number 134 (or the terminal block number 135) is read, and as shown in FIG. 14, the slave apparatus 131 is installed between the terminal block and the connector (step 180). The terminal block number 134 assigned to the terminal block 50 mounted to the slave apparatus 131 is [B-001-C] and the terminal block number 135 assigned to the connector 51 mounted to the slave apparatus 131 is [B-001-P]. These terminal block numbers can be visually read, and the read each terminal block number is manually entered into the display apparatus and control apparatus 121. A RFID stored the terminal block number 134 is stuck on the terminal block 50, and a RFID stored the terminal block number 135 is stuck on the connector 51. Each terminal block number stored in each RFID is read by using a reading apparatus and is directly entered into the display apparatus and control apparatus 121. Further, a bar code is written down along the terminal block number on the terminal block 50 and the connector 51, and the bar code may be read using a reading apparatus.

Figure 24:
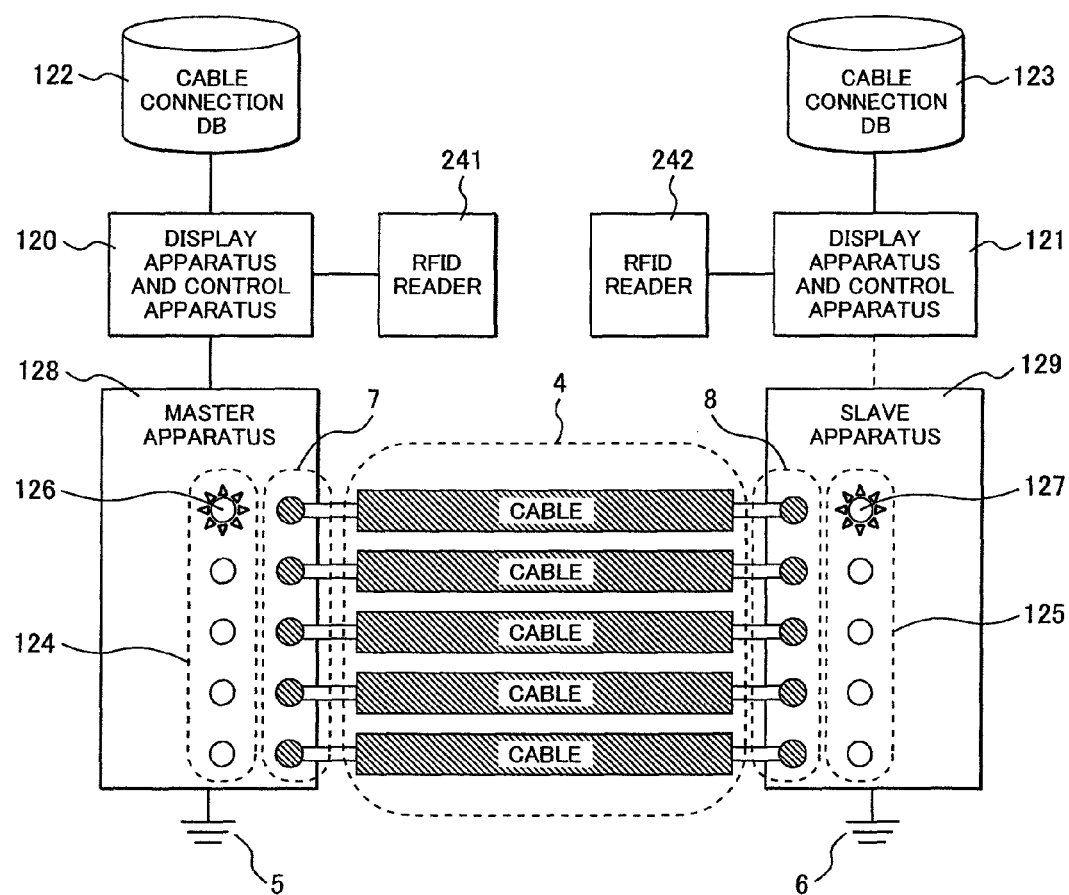
FIG. 24 is a structural diagram showing a cable connection support apparatus, which is another embodiment, using a RFID reader.
Figure 26:
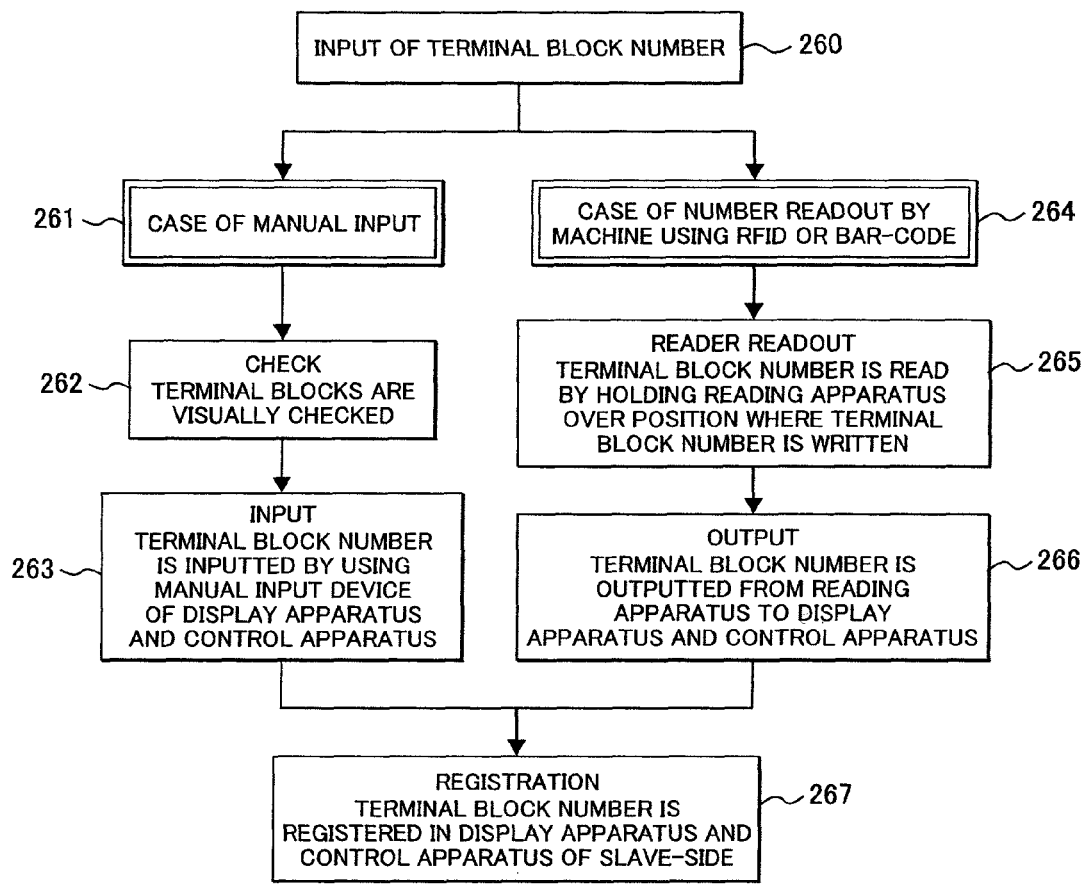
FIG. 26 is a detail flowchart showing an example of a reading a terminal block-reading process shown in FIG. 18.

FIG. 26 shows a work flow of the readout of the terminal block number shown in FIG. 18. The readout of the terminal block number has two types of procedures: a readout mode 261 where data is manually entered and a readout mode 264 where a machine reads a terminal number using an RFID or a bar-code. First, the manual readout mode 261 is explained. In a checking procedure 262, the worker checks visually the terminal block number 134 (or the terminal block number 135) shown in FIG. 13. In an input mode 263, the worker enters the visually-checked terminal block number into the display apparatus and control apparatus 121 by the manual input device (keyboard, touch panel, or the like). In the registration mode 267, the display apparatus and control apparatus 121 registers the inputted terminal block number. In the readout mode 264 in which the machine is used, as shown in FIG. 24, a RFID reader 241 of the master-apparatus side is connected to the display apparatus and control apparatus 120 of the master-apparatus side, and a RFID reader 242 of the slave-apparatus side is connected to the display apparatus and control apparatus 121 of the slave-apparatus side. When bar-code is used, a bar-code reader is used. In a reader readout mode 265, these RFID readers are used to read each terminal block number assigned to the terminal block 50. Moreover, when the ID information already stored in the RFID at the manufacturing of the RFID is a unique number, there is a product of the RFID in which the ID information cannot be rewritten and added. When using such a product, a table which associates the ID information of the RFID with a terminal block number can be provided and the ID information can be converted to a terminal block number. In an output mode 266, the terminal block number thus obtained is outputted from the reading apparatus, and in a registration mode 267, the terminal block number is registered in the display apparatus and control apparatus 121.

Information of a cable connected to a terminal block is acquired by referring the cable connection DB (step 181). The display apparatus and control apparatus 121 searches the cable connection DB 123 based on the acquired terminal block number and displays the searched cable number. A display example of the display apparatus and control apparatus shown in FIG. 14 is a display example where connection work is conducted for the terminal 142 of terminal block number [B-003] on the terminal block 50. When conducting the connection work for terminal block number [B-003], the cable connection DB 123 is searched based on the acquired terminal block number and the searched cable number of the cable to be connected is displayed on the display apparatus and control apparatus 121. In the example shown in FIG. 18, when a terminal block number is read in the step 181, the display apparatus and control apparatus 121 searches the table in FIG. 16 (cable connection information registered in the cable connection DB 123) based on the acquired terminal block number. After the search has been made, it is indicated that two cables having cable number "AAB" and cable number "AAC" are connected to the terminal block. As a consequence, the display apparatus and control apparatus 121 displays "Work target terminal block: B-003, Connected cable: AAB: AAC" about the terminal 142 as shown in FIG. 14.

Figure 27:
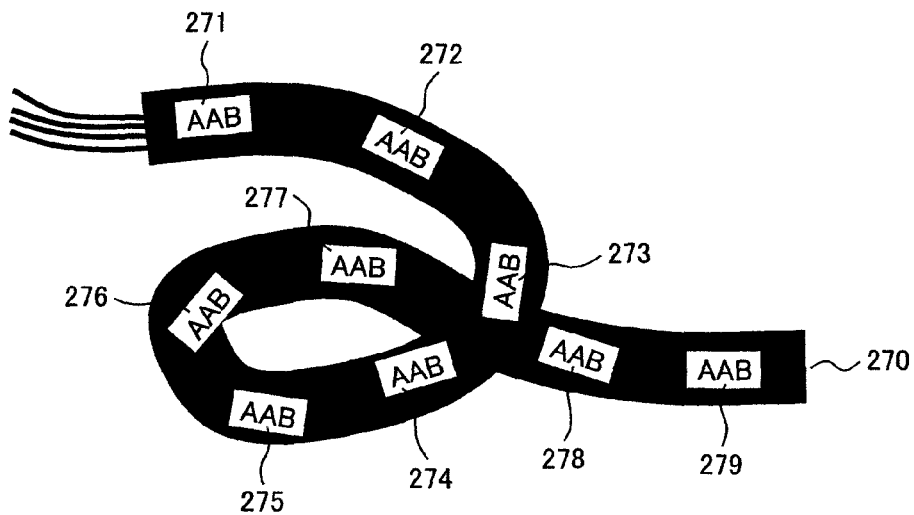
FIG. 27 is an explanatory drawing showing an example of a cable provided with a cable number.

After the displayed cable is disposed at a connection location, the applicable cable number is entered into the display apparatus and control apparatus 121 (step 182). As a cable marker 174 in FIG. 17 shows, the cable number is, or example, attached to a position near the cable end. Though not shown in figure, the cable number is also attached to another end of the cable. Furthermore, as shown in FIG. 27, cable numbers 271 to 279 (character description, bar-code print, built-in or attached RFID) may be attached on an entire surface of the cable 270. That cable number is read by the same method as the input method of the terminal block number shown in FIG. 26, by which a terminal block number has been entered. Moreover, a method of attaching the cable numbers may be, for example, a method of attaching a cable marker 174 to the cable end, or a method of manually entering the cable number after visual checking has been completed. Further, the method of attaching the cable numbers may be a method of automatically entering the cable number by a reading apparatus using an RFID or a bar-code. This input of the cable numbers is executed in order to confirm that the cable number indicated by the LED 141 has been properly selected and the cable has been disposed in the vicinity of the connection location. Therefore, if a number other than the cable number indicated by the LED 141 is read, the display of the error and the like can be conducted on the display, thereby preventing cable connection errors.

After a terminal treatment (removal of cable sheath, peeling of an isolator of cable wire, attaching of a connecting terminal jig to a conductor of a cable wire) of the selected cable has been completed, instruction command of the cable connection work instructions is entered into the display apparatus and control apparatus 121 (step 183). The display apparatus and control apparatus 121 turns on an LED positioned at position of the connected terminal of the navigation LED group 125 based on the instruction command, in order to clearly show the position of the cable connection. The worker connects the cable to the applicable terminal of the terminal block 50 based on the turned on LED (step 184).

Figure 28:
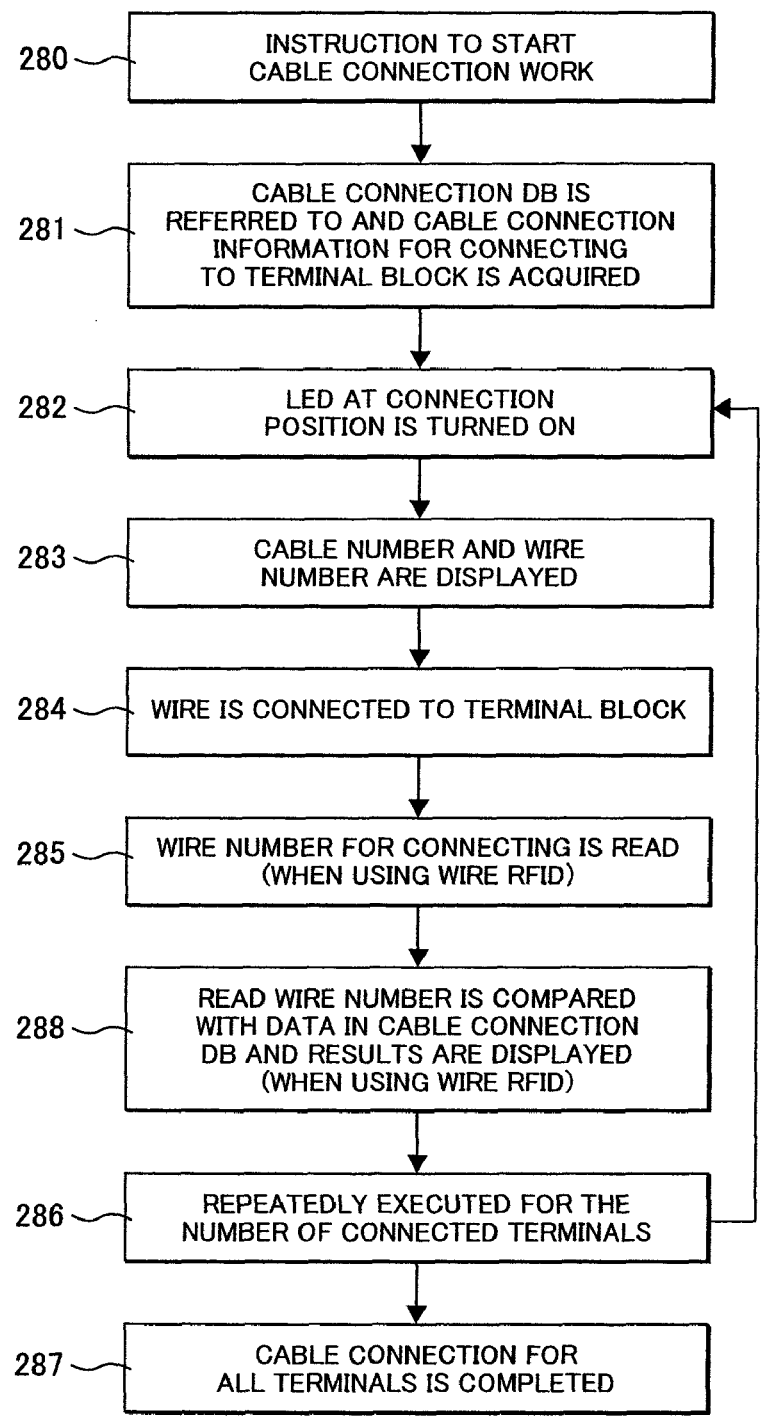
FIG. 28 is an explanatory drawing showing a detail processing procedure on cable connection work shown in FIG. 18.

When the displayed every cable was disposed in the vicinity of the connection location, and the work of the step 184 was completed, that is, the every cable was connected to the terminal block 50 of the slave-apparatus side 129, the cable connection work is completed in the slave-apparatus side 129. The work and processing performed in the step 184 will be described in detail with reference to FIG. 28.

Instruction command of the start of the cable connection work is entered (step 280). The worker located in the vicinity of the slave apparatus 129 inputs the instruction command of the start of the cable connection work into the display apparatus and control apparatus 121. The cable connection information for connecting to the terminal block is acquired (step 281). The display apparatus and control apparatus 121 that entered the instruction command the start of the cable connection work searches the cable connection DB 123 based on the terminal block number entered in the step 182, and acquires the connection information about the cable to be connected to the terminal block 50 (terminal block 8). For example, for terminal block [B-003], it is the connection information shown in FIG. 16.

Figure 29:
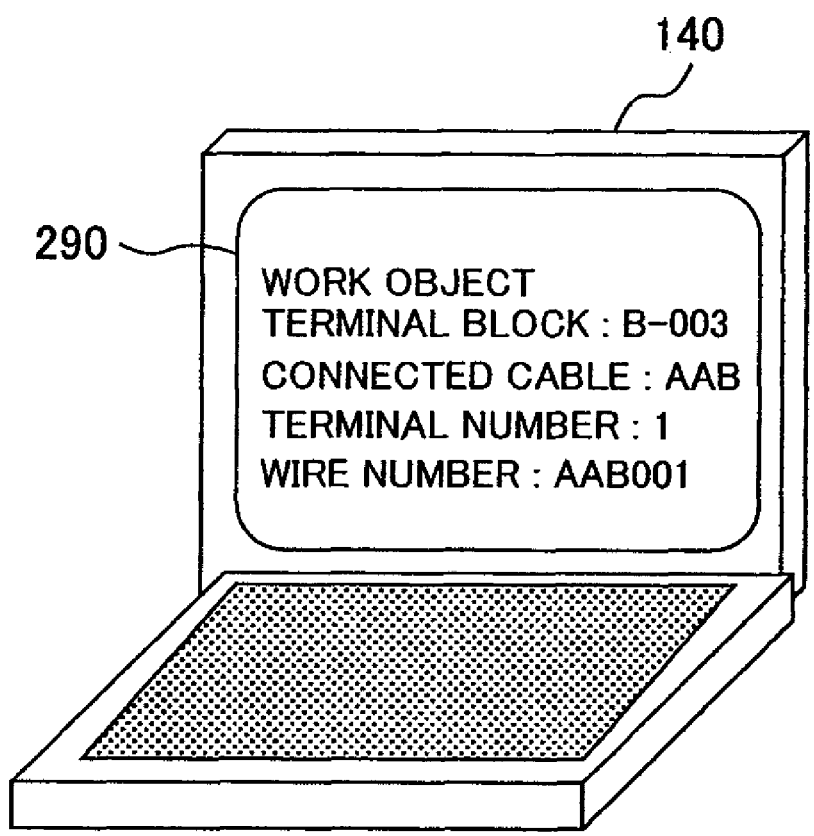
FIG. 29 is an explanatory drawing showing an example of display of cable connection.

The display apparatus and control apparatus 121 turns on the LED at a position that corresponds to the terminal number for connecting to the terminal block 8 which connects to the slave apparatus 129 (step 282). For example, a LED 141 is turned on as shown in FIG. 14. Furthermore, similar to display contents 290 shown in FIG. 29, the display apparatus and control apparatus 121 displays "Work object terminal block: B-003, Connected cable: AAB, Terminal number: 1, Wire number: AAB001" (where terminal number 1 is a position of the connection object).

The worker carries out the cable connection work of the cable wire to the terminal of the terminal block based on the position at which an LED is illuminated and the displayed information (for example, display contents 290) (step 284).

When an RFID or a bar code is attached to the cable wire, the wire number is read by the use of an RFID reader or a bar-code reader (step 285).

The display apparatus and control apparatus 121 compares the read wire number with the wire number for the cable wire connected to the terminal of the terminal number of the connection object. When the display apparatus and control apparatus 121 determines that these wire numbers are different, "connection error" is displayed on the display apparatus and control apparatus 121.

The processing and work of the steps 280-285 and 288 be repeatedly executed for the number of terminals to which the cable wires are connected (step 286), and when all terminals mounted to the terminal block 8 are connected to the cable wires, the cable connection work is completed (step 287).

The slave apparatus is shifted to a stand-by mode (step 185). After the cable connections for all the terminals of the terminal block 8 mounted to the slave apparatus 129 have been completed, the display and control apparatus 121 is detached from the slave apparatus 129 by the worker. Therefore, the slave apparatus 129 connected to the cable wire of the cable 4 through the terminal block 8 is shifted to the stand-by mode 185 for receiving a request signal from the master apparatus 128.

When this work has been finished, the worker moves to in the vicinity of the terminal block 7 mounted to the master apparatus 128.

In the master apparatus 128, the processing and the work of the steps 180-184 performed in the slave apparatus 129 are executed (step 186). Each of the steps 180-183 exclusive of the placement of the master apparatus in the step 180 and the work of the step 184 is executed in the display apparatus and control apparatus 120.

When the processing and the work in the step 186 in the master-apparatus side 128 have been completed, the connection check processing of the cable wire in the master-apparatus side 128 executed in the embodiment 1 is executed in the master-apparatus 128 while communicating between the master apparatus 128 and the slave apparatus through the cable 4 (step 187). This connection check processing of the cable wire is executed by the display apparatus and control apparatus 120. The "connection destination", "inter-continuity", "grounded connection", "unintentional disconnection", and "resistance value" are checked for each cable wire by the execution of the connection check processing of the cable wire.

The check results are compared with the wiring diagram information stored in the cable connection DB 122 of the master-apparatus side 128, and when a trouble generates in the cable connection, detail of the trouble is displayed on the display apparatus and control apparatus 120 (step 188).

After the trouble has been fixed, the master apparatus 128 is detached from the terminal block 7, and the terminal block is connected to the original connector position. Consequently, the works of the master-apparatus side are finished (step 189).

The worker moves to the slave-apparatus side 129 again, detaches the slave apparatus 129 from the terminal block 8, and connects the terminal block 8 to the original connector position. Consequently, the works of the slave-apparatus side are also finished (step 190).

Moreover, in the above flow, it seems that the worker moves between the slave apparatus 129 and the master apparatus 128 for each set of terminal blocks, however, it is possible to prepare a plurality of slave apparatuses and a plurality of terminal blocks may be worked on collectively. In the present embodiment, since the power is supplied from the master apparatus to the slave apparatus, even though the work procedures are not continuous, there is no problem with the depletion of the battery of the slave apparatus 129.

In the present embodiment, each effect attained in the embodiment 1 can be obtained. Further, according to the present embodiment, comparison between the wire connections and a wiring diagram can be automatically executed, which was the issue in embodiment 1. It is possible to provide an apparatus and system that does not require manpower to switch test cables, thus, the occurrence of human errors can be prevented.

[Embodiment 3]

Figure 25:
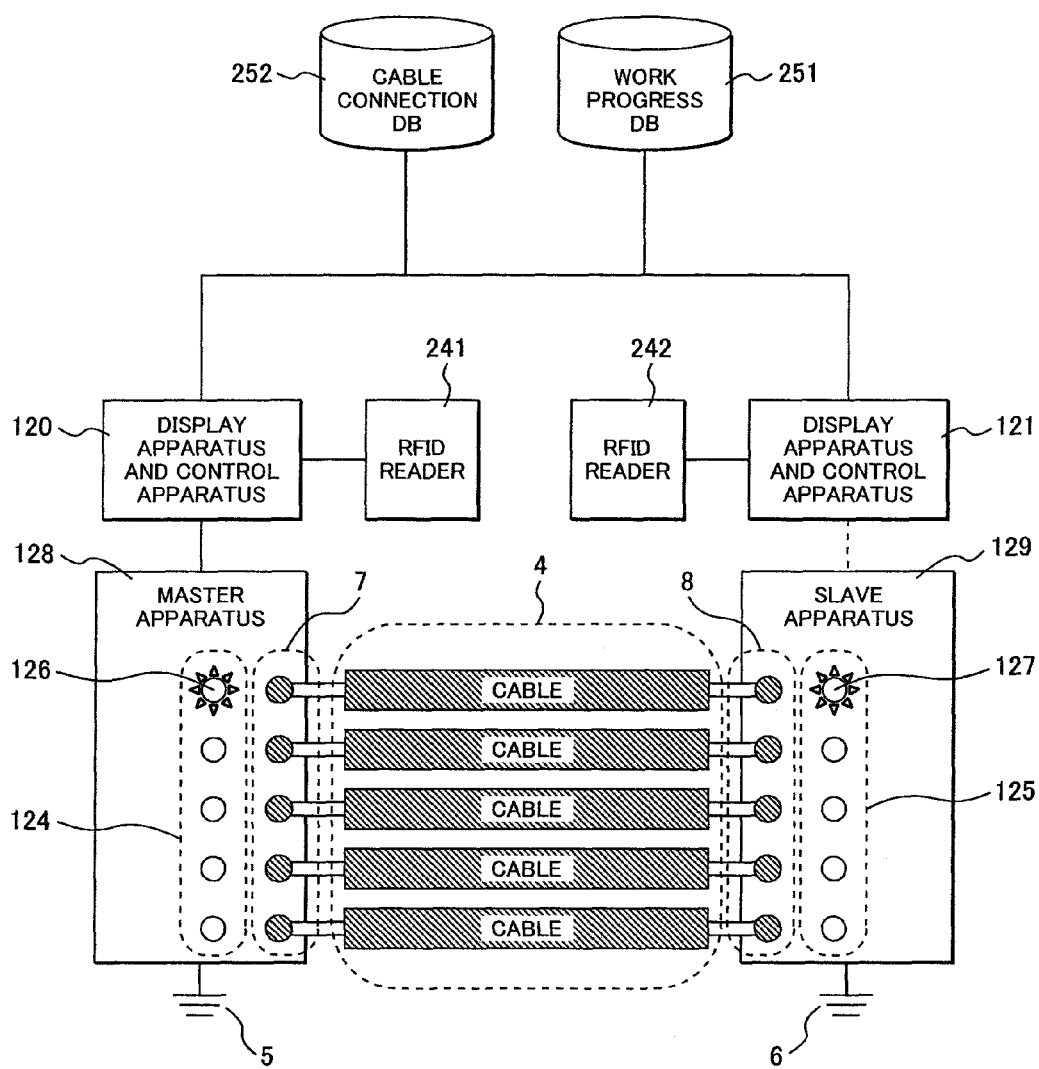
FIG. 25 is a structural diagram showing a cable connection support apparatus according to embodiment 3, which is another embodiment of the present invention.

A cable connection support apparatus according to embodiment 3, which is another embodiment of the present invention, will be explained below with reference to FIG. 25. The cable connection support apparatus of the present embodiment can be visually displayed progress state of connection work procedures based on the time at which wire connections are checked.

The cable connection support apparatus of the present embodiment has a cable connection database 252 in place of the cable connection databases 122 and 123, and adds to a progress state database 251 in the cable connection support apparatus shown in FIG. 24. A structure of the cable connection support apparatus can be simplified by using the cable connection database 252 being one database that the cable connection databases 122 and 123 were unified.

Figure 31:
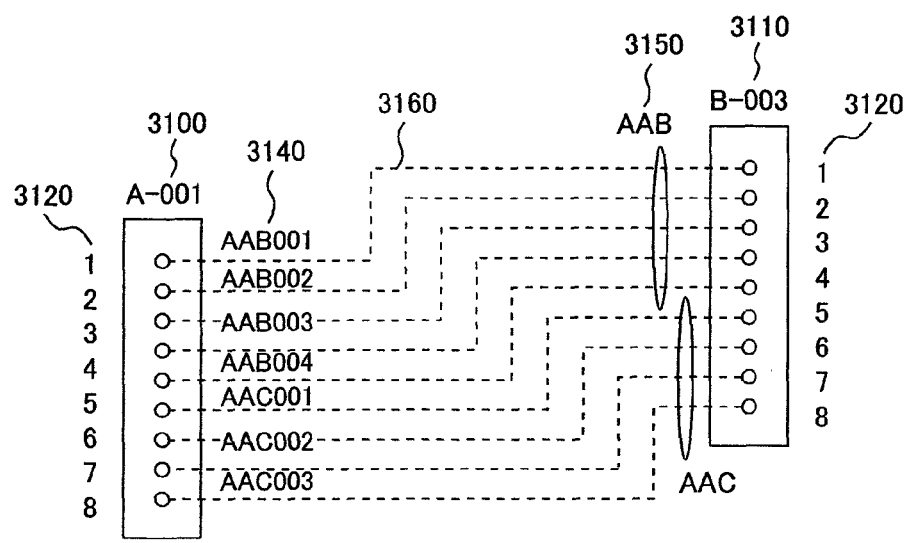
FIG. 31 is an explanatory drawing showing an example of a wiring diagram in the initial state stored in a wiring diagram database shown in FIG. 25.

An example of information stored in work progress database 253 is shown in FIG. 30. For each terminal block number 3050, the time 3010 at which connection work for the terminal number 3000 has been finished and the resistance value 3020 of the cable wire can be registered. Furthermore, "unfinished" 3040 has been registered for the number for the terminal that has not been connected. The cable connection database 252 initially stores wiring diagram information shown in FIG. 31. Terminal block number 3100 and terminal block number 3110 are the terminal block number. Terminal number 3120 and terminal number 3130 are the terminal number. Cable wire number 3140 is the cable wire number. Cable number 3150 is the cable number. The wiring in the initial state (unconnected) is shown by broken lines 3160.

Figure 32:
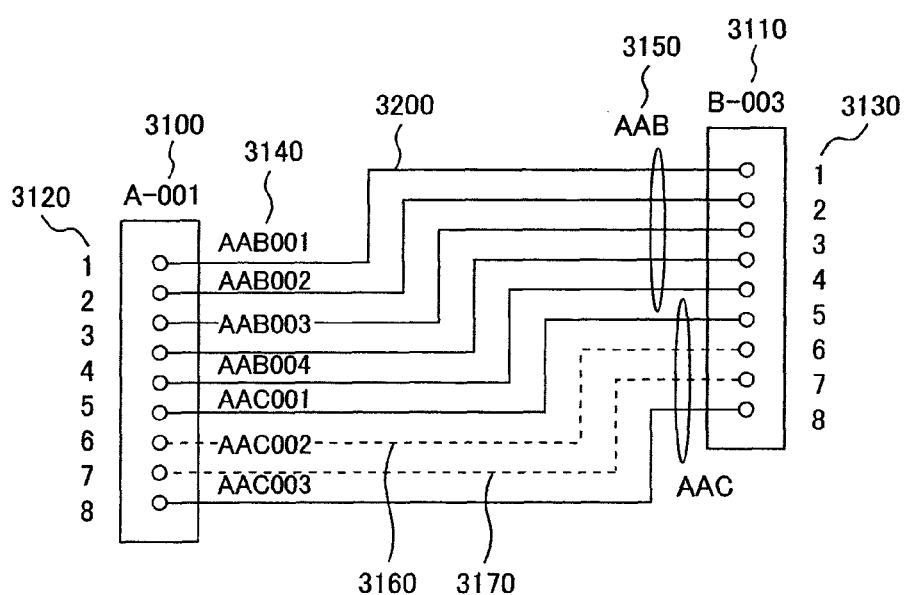
FIG. 32 is an explanatory drawing showing an example of a wiring diagram where normal connection has been confirmed.

Before connection work is started, finish time 3010 stored in the progress state database shown in FIG. 30 is all in the "unfinished" state. In the method of supporting the cable connection, the connection check processing (step 187) which is executed in embodiment 2 and shown in FIG. 18 is executed while the master apparatus and the slave apparatus communicate with each other, and the "connection destination", "inter-continuity", "grounded connection", "unintentional disconnection", and the "resistance value" are confirmed. When a normal connection is confirmed in the connection check processing, the finish time and the connection resistance value are registered in the finish time column which corresponds to the terminal number. Furthermore, if a trouble is detected in the connected cable wire by inspection, the cause of the trouble is registered in the resistance value column. In the example shown in FIG. 30, the cable wire connected to the terminal of the terminal number 6 is the "unintentional disconnection" and the cable wire connected to the terminal of the terminal number 7 is the "grounded connection". Moreover, in the cable connection database 252, when a normal connection is confirmed, the connection information is changed from a broken line to a solid line 3200 by the display apparatus and control apparatus 120 (FIG. 32). Consequently, when the stored connection information is the broken line, a cable wire plotted by this connection information is an unfinished state. When the stored connection information is the solid line, a cable wire plotted by this connection information is a connected state. Thus, it can be visually indicated that the cable wires plotted by the broken lines 3160 and 3170 is unfinished, and the cable wires plotted by the solid line 3200 is the connection finish, by displaying these information on the display apparatus and control apparatus. In the present embodiment, although a description was given of a circuit located between a pair of terminal blocks as an example, application can be made to all of the circuits in the apparatus. By doing so, it is possible to visually indicate the progress of cable connection work in the entire apparatus.

Furthermore, the connection resistance value 3020 is also stored in the database along with the measurement time. Therefore, it is possible to measure the change over time of the resistance value of the cable by using the stored information and measuring again the resistance value after a certain time has elapsed. Consequently, application is possible for the future maintenance work.

In the present embodiment, each effect attained in the embodiment 1 can be obtained.

Moreover, as measurement of the resistance value has been described in the present embodiment, impedance can be measured by the same method. Also, the impedance immediately after a connection has been made as well as change over time of the impedance can also be measured.

[Reference Signs List]

1, 128: master apparatus, 2, 129: slave apparatus, 3: display apparatus, 4, 301: cable, 7 305: terminal block of master-apparatus side, 8, 302: terminal block of slave-apparatus side, 9, 12: scanning apparatus, 10: resistance measuring apparatus, 120, 121, 310, 329: display apparatus and control apparatus, 122, 123, 253 cable connection database, 241, 242: RFID reader, 251: work progress state database, 304, 305: scanning circuit, 308: differential voltage detection circuit, 309: master apparatus CPU, 316: slave apparatus CPU.

What is claimed is:

1. A cable connection support apparatus, comprising:
   a master apparatus installed on one end of a cable wire;
   a slave apparatus installed on another end of said cable wire, and to which power is supplied from said master apparatus through said cable wire;
   said master apparatus having an apparatus for requesting an ID assigned to each terminal on said slave apparatus side from said slave apparatus by use of said cable wire and a grounding;
   said slave apparatus having an apparatus for transmitting said ID according to a request made by said master apparatus by the use of said cable wire and a grounding; and
   an apparatus for detecting connection condition of said cable wire by reading said transmitted ID by said master apparatus.

2. The cable connection support apparatus according to claim 1,
   wherein said master apparatus has a first scanning apparatus for controlling a plurality of switches included in said master apparatus; and
   said slave apparatus has a second scanning circuit for controlling a plurality of switches included in of said slave apparatus.

3. The cable connection support apparatus according to claim 1, further comprising:
   a device having ID information and attached to said cable wire; and
   a reading apparatus for reading said ID information of said device,
   wherein said ID information read by said reading apparatus is specified as said ID.

4. The cable connection support apparatus according to claim 1, further comprising:
   an apparatus for detecting a value of current flowing through the cable wire when said ID is transmitted; and
   an apparatus for detecting one of a resistance value of said wiring path, presence or absence of inter-continuity of cables, grounding, and open connection based on said current value.

5. The cable connection support apparatus according to claim 1, further comprising:
   a first database for storing progress state of connection work;
   a second database for storing cable connection condition;
   an apparatus for selecting object connection work based on received cable information; and
   an apparatus for turning on an LED in connecting terminal position.

6. The cable connection support apparatus according to claim 1, further comprising:
   a first database for storing progress state of connection work;
   a second database for storing cable connection condition; and
   an apparatus for recording a completion time of said connection work and resistance value of said cable wire in said database for storing said progress state.

7. The cable connection support apparatus according to claim 6, further comprising:
   an apparatus having a display function for displaying a visualized state that is changed between when said work is unfinished and when said work is finished.

8. A cable connection support apparatus, comprising:
   a master apparatus having a first terminal block for each cable wire;
   a slave apparatus having a second terminal block for each cable wire, and to which power is supplied from said master apparatus through said cable wire,
   said master apparatus having an apparatus for reading an identification ID of said slave apparatus connected to a cable end for each cable wire, and a scanning apparatus;
   said slave apparatus having an apparatus for transmitting an identification ID according to a request made by said master apparatus;
   a first database stored first information on connection of said cable wire;
   a second database stored second information indicating a relation between said first terminal block and said second terminal block; and an apparatus for comparing ID information of said slave apparatus scanned by said scanning function with said wiring connection related database, and detecting a wiring error.

9. A method of supporting cable connection, steps of:

attaching a master apparatus to one end of a cable wire included in a cable, and to which power is supplied from said master apparatus through said cable wire;

attaching a slave apparatus to another end of said cable wire, requesting an ID assigned to each terminal of said slave-apparatus side from said master apparatus to said slave apparatus by using said cable wire and a grounding;

transmitting said ID according to said request from said slave apparatus by using said cable wire and said grounding, reading said transmitted ID by said master apparatus; and detecting the connection condition of said cable wire.

10. The method of supporting cable connection according to claim 9, wherein the request for said ID is made by sequentially switching control of switches of said master apparatus.

11. The method of supporting cable connection according to claim 9, wherein said detection of said connection condition of said cable wire includes a step of comparing ID information with information in the wiring connection related database, and a step of detecting a wiring error.

12. The method of supporting cable connection according to claim 9, wherein completion time of said connection work and the resistance value of said cable wire is recorded in said database for storing work progress.

13. The method of supporting cable connection according to claim 9, wherein a visualized state is displayed and changed between when said work is unfinished and when said work is finished.

* * * * *